United States Patent
Suzuki et al.

(10) Patent No.: US 6,404,102 B1
(45) Date of Patent: Jun. 11, 2002

(54) PIEZOELECTRIC RESONATOR AND PIEZOELECTRIC RESONATOR PART

(75) Inventors: Toshiyuki Suzuki; Nobuyuki Miki; Masakazu Hirose; Masayoshi Inoue, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/631,699

(22) Filed: Aug. 3, 2000

(30) Foreign Application Priority Data

Aug. 5, 1999 (JP) .......................................... 11-223068
Dec. 22, 1999 (JP) .......................................... 11-365425
Apr. 7, 2000 (JP) ....................................... 2000-107109

(51) Int. Cl.$^7$ .............................................. H01L 41/08
(52) U.S. Cl. ...................... 310/320; 310/344; 310/348; 310/368
(58) Field of Search ................................. 310/320, 367, 310/368, 348, 354, 355, 356, 344

(56) References Cited

U.S. PATENT DOCUMENTS

| 4,139,793 A | * | 2/1979 | Michel | 310/367 X |
| 4,603,276 A | * | 7/1986 | Coursant | 310/368 |
| 5,684,436 A | * | 11/1997 | Kaida | 310/368 X |
| 5,736,911 A | * | 4/1998 | Watanabe | 310/368 X |
| 5,942,836 A | * | 8/1999 | Yoshida et al. | 310/320 |

FOREIGN PATENT DOCUMENTS

| JP | 60-123120 | 7/1985 |
| JP | 1-236715 | 9/1989 |
| JP | 6-252688 | 9/1994 |
| JP | 8-237066 | 9/1996 |

* cited by examiner

Primary Examiner—Mark O. Budd
(74) Attorney, Agent, or Firm—Oblon, Spivak, McClelland, Maier & Neustadt, P.C.

(57) ABSTRACT

A piezoelectric substrate is constituted by a piezoelectric material of an effective Poisson's ratio being less than 1/3. The substrate has a pair of opposite faces and the opposite faces are provide with a pair of vibrating electrodes in correspondence. The opposite faces of the piezoelectric substrate are rectangular respectively. The sum of the lengths Lc of the one faces in the opposite faces 1a, 1b and the length Wc of the other side of the same is limited within range 2.22 mm$\leq$$\leq$2.24 mm or 2.34 mm$\leq$$\leq$2.48 mm, said one faces being vertical each other. The areas Sc of the opposite faces are 1.22 mm$^2$$\leq$Sc$\leq$1.26 mm$^2$ or 1.35 mm$^2$$\leq$Sc$\leq$1.538 mm$^2$. Accordingly, though using the piezoelectric material of the effective Poisson's ratio being less than 1/3, vibration in the thickness extensional fundamental waves can be steadily utilized.

24 Claims, 22 Drawing Sheets

PIEZOELECTRIC RESONATOR AND PIEZOELECTRIC RESONATOR PART

BACKGROUND OF THE INVENTION

1. Field of the Invention

The present invention relates to a piezoelectric resonator and a piezoelectric resonator part.

2. Description of the Related Art

The piezoelectric resonators using piezoelectric ceramics have widely been employed as filters, resonators or sensors. In particular, piezoelectric materials such as lead titanate (PT) or lead zirconate titanate (PZT) are cheaper than piezoelectric single crystal materials. Therefore these piezoelectric ceramics have been widely used as resonators for generating basic clock signals in reproduction apparatus of recording media as CD-ROM (Compact Disc-Read Only Memory) or DVD (Digital Versatile Disc). However, since these piezoelectric materials contain lead (Pb), it has been demanded to develop a piezoelectric material without containing lead for less environmental impact.

Known piezoelectric materials without containing lead include, for example, compounds having perovskite structure and solid solutions thereof such as tantalate compounds or niobate compounds and, ilmenite structure compounds and solid solutions thereof, bismuth layer compounds, or compounds having the tungsten—bronze structure. Of these substances, the bismuth layer compounds have excellent properties, so that dielectric constant is low, piezoelectricity is relatively large, mechanical quality coefficient, Qm, is high and the Curie temperature is high, so that this compound deteriorates less at high temperature.

However, the effective Poisson's ratio of these piezoelectric materials is less than 1/3. Consequently, the fundamental thickness extensional wave vibration could not be used in energy trapping. Utilization of the fundamental wave was difficult in a structure similar to that of the piezoelectric resonator using the piezoelectric material of the effective Poisson's ratio being 1/3 or higher such as PZT, for example, in a structure where a pair of opposite faces of the piezoelectric substrate are furnished with a pair of electrodes having smaller areas than the area of the piezoelectric substrate. In the piezoelectric resonator using these piezoelectric materials, there are many piezoelectric resonators suppressing vibrations of the fundamental waves and utilizing tertiary harmonics in the thickness extensional vibration.

However, with respect to a resonance sharpness value, Q, indicating easy occurrence of vibration in a specific wavelength, as the tertiary harmonic wave was smaller than the fundamental wave, there was a problem in utilizing the tertiary harmonics. The vibration of the fundamental wave having a large Q was suppressed by damping and the vibration of the tertiary harmonics having a small Q was used by necessity so a stable vibration could not be obtained. Thus, although the piezoelectric material not containing lead has been in demand, a general practice has been difficult.

Further, it is generally known that the piezoelectric resonating part utilizes a piezoelectric vibrator as a resonator for obtaining an oscillation frequency. The piezoelectric vibrator is formed with a piezoelectric element with a pair of opposing electrodes located on either side thereof. The piezoelectric vibrator is laminated onto a capacitor element in a manner that one side surfaces located in the thickness direction are positioned opposite to each other, the capacitor element having two load capacities formed thereon. Further, connecting conductors are provided to electrically and mechanically connect input electrodes, output electrodes and ground electrodes. A cap is provided to seal the piezoelectric resonating part.

Such a piezoelectric resonating part is disclosed, for example, in JP-A-60-123120, JP-A-1-236715, JP-A-8-237066 or JP-A-10-135215 and others.

As the piezoelectric resonating part utilizing thickness extensional vibration mode, one is generally known utilizing a fundamental wave vibration mode and another one is known utilizing a harmonic vibration mode, in particular a tertiary harmonic vibration mode.

The typical example of piezoelectric resonating part utilizing the tertiary harmonic vibration mode is of a type for energy trapping. The piezoelectric resonating part of this type includes the piezoelectric substrate having some non-vibrating portions. With these portions being fixed and supported, it is possible to obtain the piezoelectric resonating part which is free of property deterioration and may be widely utilized.

The piezoelectric resonating part in the thickness extensional vibration mode utilizes the fundamental wave vibration. It may, therefore, obtain a high Q max resonant property. However, in contrast to the energy trapping type, it has difficulty in obtaining the non-vibrating portions. Especially in the case when the piezoelectric resonating part is made small-sized, the piezoelectric substrate itself will vibrate, and this will make it impossible to fix and support to the piezoelectric substrate.

Since the piezoelectric resonating part utilizes the fundamental wave vibration mode, when the piezoelectric is mounted onto the dielectric substrate, a viscosity change of electrically conductive paste at the time of connection will occur. This will cause the connection areas to be uneven, and the paste will often spread out, making the adhesion strength unstable. Accordingly, the suppression of vibration energy by the piezoelectric resonating part will cause deterioration of the resonant property, and failure of complete suppression of the unnecessary vibration will further deteriorate the resonant property. Thus, the piezoelectric resonating part will often fail to produce stabilized oscillation which is, for example, free of skipped oscillation and others.

SUMMARY OF THE INVENTION

It is an object of the present invention to provide a piezoelectric resonator by using the piezoelectric material with the effective Poisson's ratio being less than 1/3, enabling it easy to obtain stable vibration.

It is another object of the invention to provide a piezoelectric resonating part capable of preventing the attenuation of vibration energy to minimum and supporting the piezoelectric resonator under a stabilized condition.

According to a first aspect of the present invention, a piezoelectric resonator comprises a piezoelectric substrate containing a piezoelectric material of an effective Poisson's ratio being less than 1/3. This piezoelectric substrate having a pair of opposite faces; a pair of corresponding electrodes on said opposite faces; wherein the opposite faces of the piezoelectric substrate are rectangular; and the sum of the length of one side of the face and the length of the other perpendicular side of the same face is limited within the range from 2.22 to 2.24 mm or the range from 2.34 to 2.48 mm.

In the piezoelectric resonator according to the first aspect of the present invention, since the sum of the length of one side of the face and the length of the other perpendicular side of the same face is limited within the range from 2.22 to 2.24 mm or the range from 2.34 to 2.48 mm, it is possible to make use of the vibration of the fundamental wave, and stable vibration is available.

In the piezoelectric resonator it is preferable that, for example, the respective lengths of one of the sides of these opposite faces of the piezoelectric substrate are within the range from 1.06 to 1.24 mm, and the respective lengths of the perpendicular sides are within the range from 1.16 to 1.30 mm. It is more preferable that the respective lengths of one of the sides of the opposite faces are limited within range from 1.16 to 1.22 mm, and respective lengths of the perpendicular sides are limited within range from 1.18 to 1.22 mm. Further, it is preferable that the piezoelectric substrate is composed to include the bismuth layer structure containing bismuth-strontium-titanium-oxygen. The compound of the bismuth layer structure may contain lanthanum.

According to a second aspect of the present invention, a piezoelectric resonator comprises a piezoelectric substrate containing a piezoelectric material of an effective Poisson's ratio being less than 1/3. This piezoelectric substrate having a pair of opposite faces; a pair of corresponding electrodes on said opposite faces; wherein respective areas of the opposite faces of the piezoelectric substrate are, with respect to the one side, from 1.22 to 1.26 mm$^2$ or from 1.35 to 1.538 mm$^2$.

In the piezoelectric resonator according to the second aspect, since the respective areas of the opposite faces of the piezoelectric substrate are, with respect to the one side, from 1.22 to 1.26 mm$^2$ or from 1.35 to 1.538 mm$^2$, it is possible to make use of the vibration of the fundamental wave, and stable vibration is available.

In the piezoelectric resonator of the second aspect, it is preferable that the piezoelectric substrate has a bismuth layer compound structure, for example, bismuth-strontium-titanium-oxygen.

A piezoelectric resonator according to a third aspect of the present invention comprises a piezoelectric substrate containing a piezoelectric material of an effective Poisson's ratio being less than 1/3. This piezoelectric substrate having a pair of opposite faces; a pair of corresponding electrodes on said opposite faces; wherein the opposite faces of the piezoelectric substrate are rectangular; a length of one side of the opposite face is limited within 5 times or less of the thickness of the piezoelectric substrate; and a length of the other side perpendicular with said one side of the opposite face is limited within the range from 0.93 times to 1.07 times of the length of the one side.

In this piezoelectric resonator according to the third aspect, the length of the one side of the opposite face is limited within 5 times or less of the thickness of the piezoelectric substrate, and a length of the other side perpendicular with said one side of the opposite face is limited within 0.93 times to 1.07 times of the length of the one side. Accordingly, even if a piezoelectric material of the effective Poisson's ratio being less 1/3 is used, it is possible to make use of the vibration of the fundamental wave, and stable vibration is available.

In the piezoelectric resonator according to the third aspect, it is preferable that the area of the vibrating electrode is 6% or more of the area of the opposite face. Preferably, the piezoelectric substrate is a bismuth layer compound, for example, bismuth-strontium (Sr)-titanium (Ti)-oxygen (O), and further the piezoelectric substrate may be composed to include lanthanum (La) and manganese (Mn).

A piezoelectric resonating part according to a fourth aspect of the present invention comprises a piezoelectric resonator, a substrate and connecting conductors. The piezoelectric resonator is operated in thickness extensional vibration mode and has two side electrodes. The two side electrodes are provided at opposite sides of the piezoelectric resonator which are different from the sides located in the thickness direction, and are conducted to vibration electrodes respectively. The substrate has terminal electrodes provided at the surface thereof. The connecting conductors include metal balls which are located between the side electrodes of the piezoelectric resonator and the terminal electrodes of the substrate and are fixed to connect the two members.

As described above, in the piezoelectric resonating part according to the fourth aspect of the invention, the piezoelectric resonator has two side electrodes provided at opposite sides thereof which are other than the sides located in the thickness direction thereof, and connected to vibration electrodes respectively. Therefore, electric energy may be supplied to the side electrodes to excite the piezoelectric resonator.

With the functions as described above, there may be realized the piezoelectric resonating part which will produce a stabilized resonating property of high Q max representing the value of resonation property while eliminating radiation of vibration energy, incomplete suppression of unnecessary oscillation, deterioration of resonating property and inferior oscillation including unstable skipped oscillation and others.

DETAILED DESCRIPTION OF THE INVENTION

The present invention will be described in detail referring to the accompanying drawings.

First Embodiment

Figure 1:
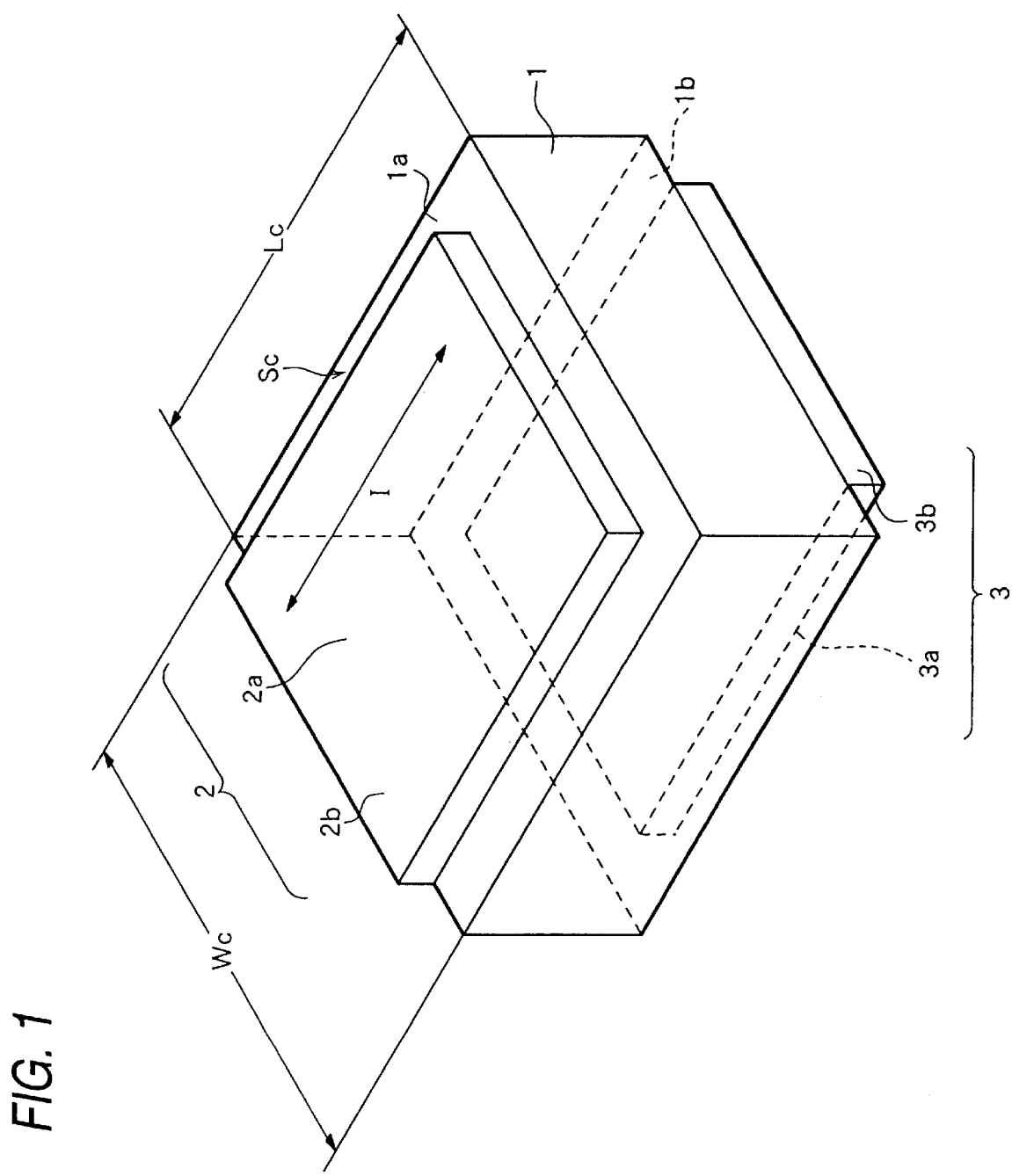
FIG. 1 is a perspective view showing the structure of the piezoelectric resonator relating to one embodiment of the invention.

FIG. 1 shows a structure of a piezoelectric resonator according to one embodiment of the invention. This piezoelectric resonator is provided with a piezoelectric substrate 1 having a pair of opposite faces 1a, 1b and an effective Poisson's ratio being less than 1/3, and a pair of electrodes 2, 3 provided in correspondence to the opposite faces 1a, 1b of the piezoelectric substrate 1.

The opposite faces 1a, 1b of the piezoelectric substrate 1 have almost the same shapes such as rectangular respectively. The rectangular shape referred to herein is a substantially sensed shape. Therefore it is allowed that a corner is somewhat truncated, or the corner is not exactly 90 degrees. The sum of a length of a vertical side of the one face of the opposite faces 1a, 1b and a length of the other side of the same is limited within range from 2.22 to 2.24 mm or range from 2.34 to 2.48 mm. That is, assuming that the length of the one side is Lc and the length of the other side Wc, the relation of the length Lc of the one side and the length Wc of the other one side is as shown in the following formula 1-1.

$$Lc+Wc = 2.22 \text{ mm} \leq \leq 2.24 \text{ mm or } 2.34 \text{ mm} \leq \leq 2.48 \text{ mm} \quad \text{(Formula 1-1)}$$

In this piezoelectric resonator, the length Lc of one sides and the length Wc of the other sides Wc of the opposite faces 1a, 1b of the piezoelectric substrate 1 are defined. Although using the piezoelectric material of the effective Poisson's ratio being less than 1/3, it is possible to obtain the preferable waveform and the high resonance sharpness Q value and make use of vibration of the fundamental wave. It is preferable that the respective lengths Lc of one sides of the opposite faces 1a, 1b are within range from 1.06 to 1.24 mm, and the respective lengths Wc of the other sides are limited within range from 1.16 to 1.30 mm. Because within these ranges, more preferable waveforms are available in the fundamental waves. The more preferable lengths Lc of one sides are from 1.16 to 1.22 mm, and with respect to the other sides the lengths Wc are from 1.18 to 1.22 mm. Incidentally, the length Lc of the one side in the present embodiment is a length of a side extended in the same direction as an extension I of leaders 2b, 3b of later mentioned electrodes 2, 3, while the length Wc of the other side is a length of a side extended in a perpendicular direction therewith.

The respective areas Sc of the opposite faces 1a, 1b of the piezoelectric substrate 1 are preferably, with respect to the one side, from 1.22 to 1.26 mm$^2$ or from 1.35 to 1.538 mm$^2$. Because within these ranges, more preferable waveforms are available in the fundamental waves.

As the piezoelectric material of the effective Poisson's ratio being less than 1/3, there are, for example, compounds having perovskite structure as tantalate compound or niobate compound and solid solutions thereof, compound having ilmenite structure and solid solution thereof, compound having pyrochlore structure, bismuth layer compound structure containing bismuth (Bi), or compound having tungsten-bronze structure. The piezoelectric substrate 1 contains these piezoelectric materials as main components being maximum contents.

As the tantalate compound or the niobate compound, for example, there are enumerated a first element of at least one selected from a group consisting of sodium (Na), potassium (K), and lithium (Li), a second element of at least one selected from a group consisting of tantalum (Ta) and niobium (Nb), and a substance containing oxygen. Assuming that the first element is A and the second element is B, these elements are expressed in a general expression shown in the following chemical formula 1-1.

$$ABO_3 \quad \text{(Chemical formula 1-1)}$$

As bismuth layer compounds, for example, there are materials including bismuth; a first element of at least one selected from a group consisting of sodium, potassium, barium (Ba), strontium, lead, calcium (Ca), yttrium (Y), lanthanoid (Ln) and bismuth; a second element of at least one selected from a group consisting of vanadium (V), zirconium (Zr), antimony (Sb), titanium (Ti), niobium, tantalum, tungsten (W), molybdenum (Mo) and manganese; and a substance containing oxygen. Assuming that the first element is C and the second element is D, these elements are expressed in a general expression shown in the following chemical formula 1-2.

$$(Bi_2O_2)^{2+}(C_{m-1}D_mO_{3m+1})^{2-} \quad \text{(Chemical formula 1-2)}$$

m: integers from 1 to 8

The tungsten-bronze compound has no general expression, but there are, for example, such as $NaWO_6BaNaNbO_{15}$. The chemical formulae herein are shown with stoichiometric composition, and the piezoelectric material for composing the piezoelectric substrate 1 may be those which are not of stoichiometric composition.

Among them, the bismuth layer compound is preferable as the piezoelectric material for composing the piezoelectric substrate 1. It is possible to provide excellent properties, especially as the resonator of the high mechanical quality coefficient Qm and high Curie temperature. For example, it is preferable that the bismuth layer compound containing bismuth-strontium-titanium-oxygen, and in particular, more preferable is, in addition to these elements, bismuth layer compound containing lanthanum.

An electrode 2 is composed of a metal such as silver (Ag) and has a vibrating electrode 2a and a leader 2b furnished continuously to the vibrating electrode 2a. The vibrating electrode 2a is formed to be such as rectangular, and is disposed substantially at the center of the opposite face 1a. The leader 2b is electrically connected to an external source (not shown) via a wire or the like, and is formed to extend from the vibrating electrode 2a toward the other one side along an extension I in the one side of the opposite faces 1a, 1b of the piezoelectric substrate 1. An electrode 3 has the same structure as the electrode 2. The vibrating electrode 3a is furnished under the vibrating electrode 2a of the electrode 2 via the piezoelectric substrate 1. A leader 3b is extended from the vibrating electrode 3a in the opposite direction of the leader 2b of the electrode 2.

The sizes of the vibrating electrodes 2a, 3a are not especially limited, and any sizes may be enough. Herein, explanation has been made to that the vibrating electrodes 2a, 3a are rectangular, but the shapes of the vibrating electrodes 2a, 3a are not especially limited, and others such as circular ones are sufficient. Also the shapes of the leaders 2b, 3b are not limited and other shapes will do, for example, it is allowed that the lengths of the other sides in the opposite faces 1a, 1b of the piezoelectric substrate 1 are different from those of the vibrating electrodes 2a, 3a.

The piezoelectric resonator of the above mentioned structure is manufactured as follows.

As a starting material of the piezoelectric substrate 1, raw materials of oxides are employed, weighed to provide a desired composition and subjected to a ball mill mixture with zirconia balls in a solvent of a pure water or acetone. The mixed raw material powder is fully dried and calcined at temperature of 700 to 900° C. after pressing. Subsequently, the calcined material is pulverized again in the ball mill, dried and pelletized by adding polyvinyl alcohol as a binder of an appropriate amount. After pelletization, the pelletized powder is formed in a thin plate of 20 mm of length×20 mm of width×about 1.5 mm of thickness under pressure of 200 MPa to 300 MPa. Thereafter, the binder is volatilized from the formed body by a heat treatment, and a real sintering is carried out at temperature of 1100 to 1350° C. After the real sintering, the thickness of the sintered body is regulated by a lapping machine so as to form a base plate of the piezoelectric substrate 1.

After the base plate is formed, a copper (Cu) for example, is subjected to vacuum evaporation to form electrodes for polarization on both surfaces of the base plate. Then, the base plate formed with the polarizing electrodes is immersed in a silicon oil heated at 200 to 300° C. and applied with electric field of 5 to 10 kV/mm for one minute. After the polarization, the polarizing electrodes are removed, and sizes of the base plates are regulated by a dicing so as to form the piezoelectric substrate 1. The opposite faces 1a, 1b are formed with electrodes 2, 3 of metal such as silver by the deposition. Thus, the piezoelectric resonator shown in FIG. 1 is formed.

The piezoelectric resonator is actuated as follows.

In this piezoelectric resonator, the leader 2a, 3a of the electrodes 2, 3 are connected to the external source via wires (not shown), and when the piezoelectric substrate 1 is applied with voltage via the electrodes 2, 3, thickness extensional vibration is generated. In other words, the vibration is generated in a direction opposite to the opposite faces 1a, 1b of the piezoelectric substrate 1. Herein, the sum of the length of the one face in the opposite faces 1a, 1b of the piezoelectric substrate 1 and the length of the other side of the same is limited within range from 2.22 to 2.24 mm or range from 2.34 to 2.48 mm respectively. The respective areas Sc of the opposite faces 1a, 1b are from 1.22 to 1.26 $mm^2$ or from 1.35 to 1.538 $mm^2$. The desirable waveform and the high resonance sharpness Q value can be obtained with respect to the vibration of the fundamental wave. It is possible to utilize the vibration of the fundamental wave.

According to the practiced embodiment, the sum of the length of the vertical one sides in the opposite faces 1a, 1b of the piezoelectric substrate 1 and the length of the other side of the same is limited within range from 2.22 to 2.24 mm or range from 2.34 to 2.48 mm respectively. The respective areas Sc of the opposite faces 1a, 1b of the piezoelectric substrate 1 are from 1.22 to 1.26 $mm^2$ or from 1.35 to 1.538 $mm^2$. Therefore, even if the piezoelectric substrate 1 is composed with the piezoelectric material of the effective Poisson's ratio being less than 1/3, the desirable waveform and the high resonance sharpness Q value can be obtained with respect to the vibration of the fundamental wave. In addition, it is possible to utilize the vibration of the fundamental wave.

Therefore, according to the present embodiment, the damping is not required, and the high Q value can be obtained in comparison with the prior art utilizing the high harmonics. Thus, stable vibration can be easily provided. It is accordingly possible to broadly put to practice the piezoelectric resonator using the piezoelectric material without containing lead, so that preservation of the environment can be secured. The piezoelectric resonator can be made small sized in response to small sized elements.

If the respective lengths Lc of one sides of the opposite faces 1a, 1b are within range from 1.06 to 1.24 mm, and the respective lengths Wc of the other sides are limited within range from 1.16 to 1.30 mm, the more preferable waveforms may be provided. If the lengths Lc of one sides are from 1.16 to 1.22 mm, and the lengths Wc of the other sides are from 1.18 to 1.22 mm, the particularly preferable waveforms are available.

EXAMPLE 1

Further explanation will be made to actual examples of the invention.

As starting materials, raw material powders of bismuth oxide ($Bi_2O_3$), lanthanum oxide ($La_2O_3$), titanium oxide ($TiO_2$), strontium carbonate ($SrCO_3$) and manganese carbonate ($MnCO_3$) were used, weighed to provide a composition of $(Sr_{0.9}La_{0.1}) Bi_4Ti_4O_{15}$, and manganese carbonate was weighed to be 0.5 mass % for $(Sr_{0.9}La_{0.1}) Bi_4Ti_4O_{15}$. The weighed powder raw material was subjected to the ball mill mixture with zirconia ball in the pure water for about 15 hours. The mixed raw material powder was fully dried and calcined at 800° C. by pressing. Thereafter, the calcined material was again subjected to the ball mill pulverization, dried and pelletized by adding polyvinyl alcohol as the binder of an appropriate amount. After pelletization, the pelletized powder was formed in a thin plate of 20 mm of length×20 mm of width×about 1.5 mm of thickness under load of 200 MPa. Thereafter, the binder was volatilized from the formed body by a heat treatment, and a real sintering was carried out at 1200° C. Thus, the sintered body of the bismuth layer compound containing $SrBi_4Ti_4O_{15}$ crystal was obtained.

After the sintered body was obtained, it was ground by the lapping machine to produce the base plate of 0.501 mm thickness. Then, the base plates were formed with the electrodes for polarization and immersed in the silicon oil at 250° C. and applied with electric field of 10 kV/mm for one minute. After the polarization, the polarizing electrodes were removed, and the base plates were performed with the dicing, and a plurality of piezoelectric substrates 1 were produced by changing sizes of the opposite faces 1a, 1b. Table 1 shows sizes of the opposite faces 1a, 1b of the produced piezoelectric substrates 1. Herein, the lengths Lc of the one sides of the opposite faces were changed by 0.02 mm within the range from 1.06 to 1.24 mm, while the lengths Wc of the other sides were changed by 0.02 mm within the range from 1.16 mm to 1.30 mm. The numerical values in Table 1 shown at the position of crossing the lengths Lc of the one sides with the lengths Wc of the other sides are the areas Sc of one sides of the opposite faces 1a, 1b.

After the piezoelectric substrates 1 were made, they were deposited on the opposite faces 1a, 1b thereof with silver electrodes 2, 3 respectively so as to obtain the piezoelectric resonators. With respect to all of piezoelectric vibrators, the vibrating electrodes 2a, 3a of the electrodes 2, 3 were rectangular, and the lengths of the sides extended in the direction I of the one sides in the opposite faces 1a, 1b of the piezoelectric substrates 1 were 1.0 mm, and the other sides perpendicular therewith were 0.9 mm.

The thus obtained piezoelectric resonators were left at room temperature for 24 hours, and the piezoelectric characteristics in the thickness extensional direction were investigated by an impedance analyzer. As the piezoelectric characteristic values, the impedance characteristics and phase characteristics were measured. From these measured results, the evaluations were made on the waveforms of main vibrating parts in the thickness extensional fundamental waves. A maximum resonance sharpness Qmax1st in the vibration of the basic (primary) wave and a maximum resonance sharpness Qmax3rd in the vibration of a tertiary harmonics are demanded, and the ratio of Qmax1st/Qmax3rd was calculated. The resonance sharpness Q value is meant by a value where an absolute value of reactance X in impedance is divided with resistance R thereof (Q=|X|/R). The maximum resonance sharpness Qmax is meant by the resonance sharpness Q value between resonance frequency and anti-resonance frequency.

Table 2 shows the evaluated results concerning the waveforms of the fundamental waves. In Table 2, ◊ marks mean that the best waveforms were obtained without the presence of spuriousness in the main vibrating part. ○ marks mean that though the spuriousness existed in the main vibrating part, the usable better waveforms were obtained. Δ marks mean that though the spuriousness existed more or less in the main vibrating part, the usable good waveforms were obtained. X marks mean that much spuriousness exists in the main vibrating part, and the waveforms impossible to use

TABLE 1

(Unit: mm²)

| | | Wc (mm) | | | | | | | |
|---|---|---|---|---|---|---|---|---|---|
| | | 1.16 | 1.18 | 1.20 | 1.22 | 1.24 | 1.26 | 1.28 | 1.30 |
| Lc (mm) | 1.06 | 1.2296 | 1.2508 | 1.272 | 1.2932 | 1.3144 | 1.3356 | 1.3568 | 1.378 |
| | 1.08 | 1.2528 | 1.2744 | 1.296 | 1.3176 | 1.3392 | 1.3608 | 1.3824 | 1.404 |
| | 1.10 | 1.276 | 1.298 | 1.32 | 1.342 | 1.364 | 1.386 | 1.408 | 1.43 |
| | 1.12 | 1.2992 | 1.3216 | 1.344 | 1.3664 | 1.3888 | 1.4112 | 1.4336 | 1.456 |
| | 1.14 | 1.3224 | 1.3452 | 1.368 | 1.3908 | 1.4136 | 1.4364 | 1.4592 | 1.482 |
| | 1.16 | 1.3456 | 1.3688 | 1.392 | 1.4152 | 1.4384 | 1.4616 | 1.4848 | 1.508 |
| | 1.18 | 1.3688 | 1.3924 | 1.416 | 1.4396 | 1.4632 | 1.4868 | 1.5104 | 1.534 |
| | 1.20 | 1.392 | 1.416 | 1.44 | 1.464 | 1.488 | 1.512 | 1.536 | 1.56 |
| | 1.22 | 1.4152 | 1.4396 | 1.464 | 1.4884 | 1.5128 | 1.5372 | 1.5616 | 1.586 |
| | 1.24 | 1.4384 | 1.4632 | 1.488 | 1.5128 | 1.5376 | 1.5624 | 1.5872 | 1.612 |

After the piezoelectric substrate 1 was made, it was deposited on the opposite faces 1a, 1b thereof with silver electrodes 2, 3 respectively so as to produce the piezoelectric.

were obtained. The presence or absence of spuriousness were judged by between the resonance frequency and the anti-resonance frequency and in the range of 0.15% or thereabout of the frequencies.

TABLE 2

| Lc (mm) | Wc (mm) | | | | | | | |
|---|---|---|---|---|---|---|---|---|
| | 1.16 | 1.18 | 1.20 | 1.22 | 1.24 | 1.26 | 1.28 | 1.30 |
| 1.06 | O | Δ | x | x | x | x | Δ | Δ |
| 1.08 | O | x | x | x | x | Δ | O | O |
| 1.10 | x | x | x | x | Δ | O | O | O |
| 1.12 | x | x | x | O | O | O | O | O |
| 1.14 | x | x | Δ | O | O | O | O | O |
| 1.16 | x | Δ | ◊ | O | O | O | O | O |
| 1.18 | Δ | ◊ | ◊ | O | O | O | O | Δ |
| 1.20 | O | O | ◊ | O | O | O | O | x |
| 1.22 | O | O | O | O | O | Δ | x | x |
| 1.24 | O | O | O | O | O | x | x | x |

Figure 2:
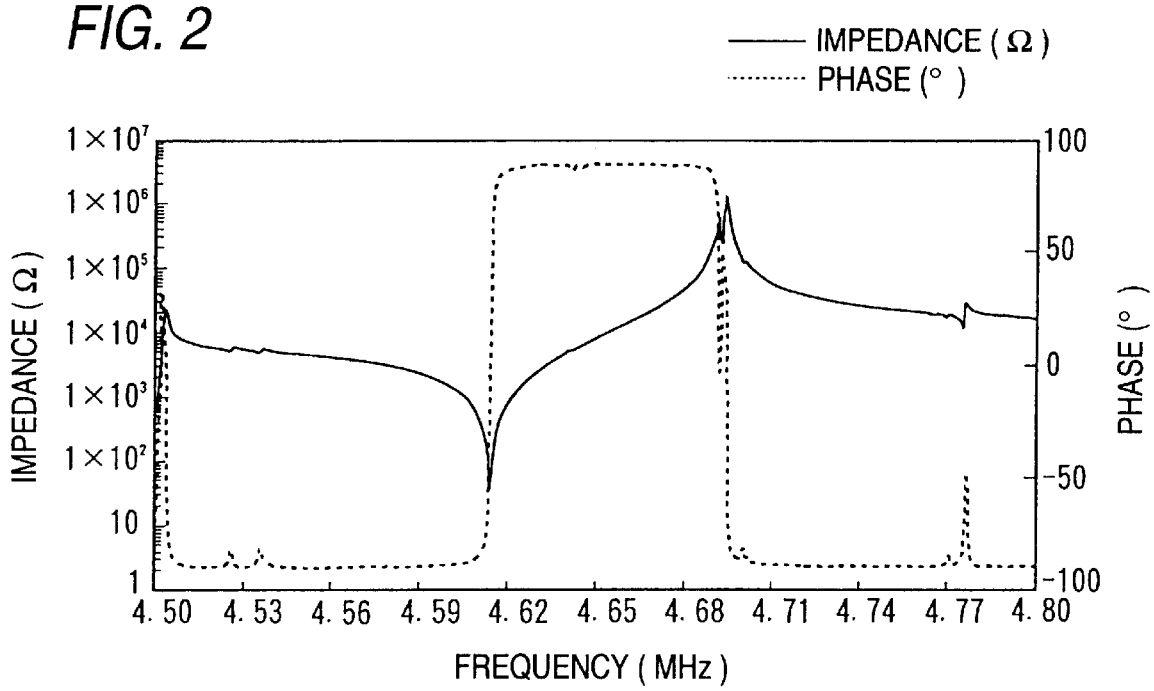
FIG. 2 is a view showing the impedance characteristic and the phase characteristic where the best ◊ waveform in Example 1 of the present invention was obtained.

FIG. 2 shows impedance characteristic and phase characteristic of the representative piezoelectric resonator where the best waveform ◊ was obtained. Those are the measured results of the piezoelectric resonators when the lengths Lc of the one sides in the opposite faces 1a, 1b of the piezoelectric substrate 1 were 1.2 mm, the lengths Wc of the other sides were 1.2 mm, and area Sc of the one side was 1.44 mm². In FIG. 2, the left side of the vertical axis is the impedance Imp ( ), the right side of the vertical axis is the phase θz (°), the lateral axis is the frequency Freq (MHz). As is seen from FIG. 2, the spuriousness does not exist in the waveform of the main vibrating part, and the vibration of the fundamental wave can be utilized.

Figure 3:
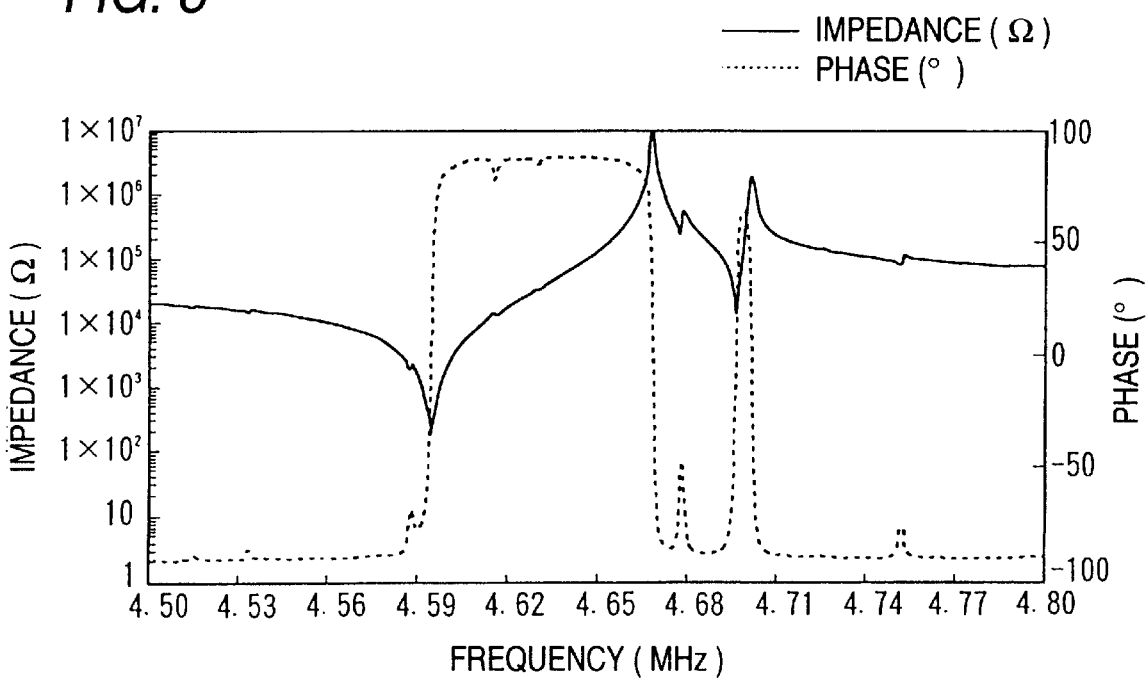
FIG. 3 is a view showing the impedance characteristic and the phase characteristic where the better ○ waveform in Example 1 of the present invention was obtained.

FIG. 3 shows impedance characteristic and phase characteristic of the representative piezoelectric resonator where the better waveform ○ was obtained. Those are the measured results of the piezoelectric resonators when the lengths Lc of the one sides in the opposite faces 1a, 1b of the piezoelectric substrate 1 were 1.18 mm, the lengths Wc of the other sides were 1.28 mm, and area Sc of the one side was 1.5104 mm². The vertical and lateral axes of FIG. 3 are the same as those of FIG. 2. In this piezoelectric resonator, as seen from FIG. 3, although the spuriousness exists in the waveform of the main vibrating part but a few, the vibration of the fundamental wave can be utilized by removing the spuriousness.

Figure 4:
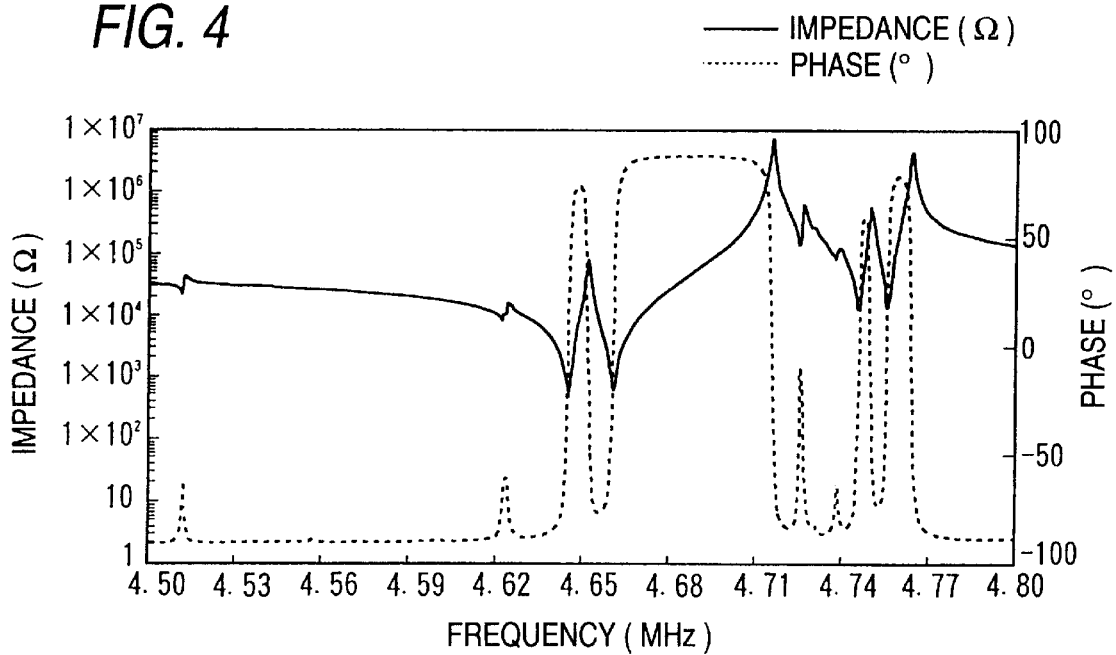
FIG. 4 is a view showing the impedance characteristic and the phase characteristic where the good Δ waveform in Example 1 of the present invention was obtained.

FIG. 4 shows impedance characteristic and phase characteristic of the representative piezoelectric resonator where the good waveform Δ was obtained. Those are the measured results of the piezoelectric resonators when the lengths Lc of the one sides in the opposite faces 1a, 1b of the piezoelectric substrate 1 were 1.06 mm, the lengths Wc of the other sides were 1.18 mm, and area Sc of the one side was 1.2508 mm². The vertical and lateral axes of FIG. 4 are the same as those of FIG. 2. In this piezoelectric resonator, as seen from FIG. 4, although the spuriousness more or less exists in the waveform of the main vibrating part, the vibration of the fundamental wave can be utilized by removing the spuriousness.

Figure 5:
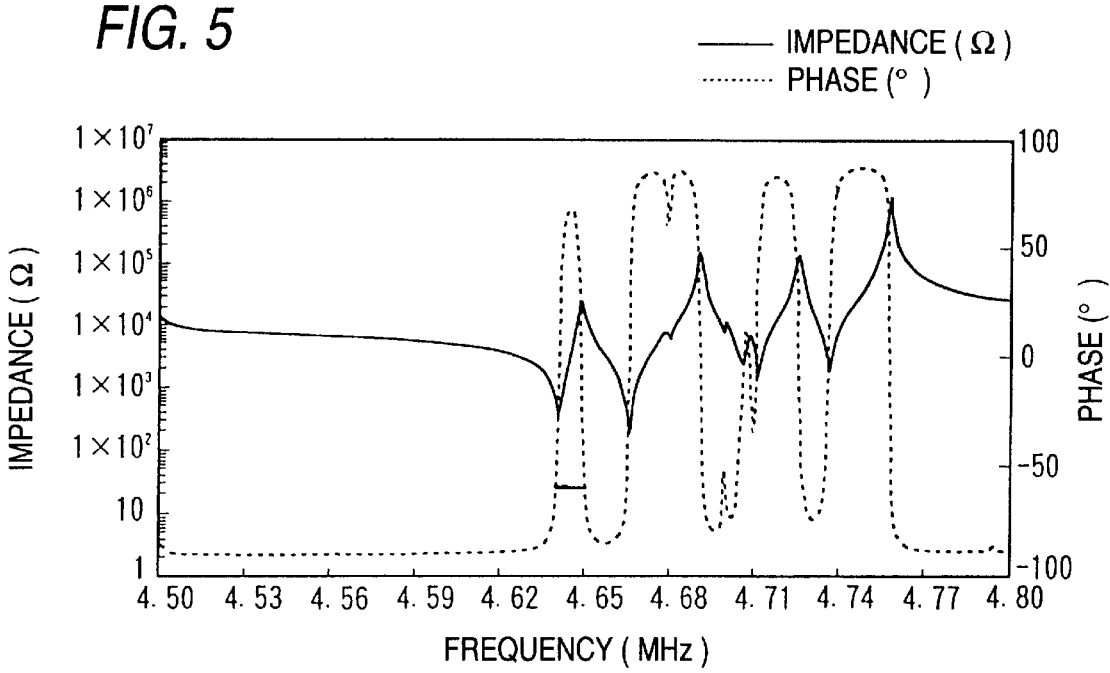
FIG. 5 is a view showing the impedance characteristic and the phase characteristic where the bad X waveform in Example 1 was obtained.

FIG. 5 shows impedance characteristic and phase characteristic of the representative piezoelectric resonator as the comparative example where the bad waveform X was obtained. Those are the measured results of the piezoelectric resonators when the lengths Lc of the one sides in the opposite faces 1a, 1b of the piezoelectric substrate 1 were 1.14 mm, the lengths Wc of the other sides were 1.18 mm, and area Sc of the one side was 1.3452 mm². The vertical and lateral axes of FIG. 5 are the same as those of FIG. 2. In this piezoelectric resonator, as seen from FIG. 5, much spuriousness exists in the waveform of the main vibrating part, and the vibration of the fundamental wave cannot be utilized.

From these results, it is found that the vibration of the fundamental wave can be utilized within the ranges shown with solid and thick lines in Tables 1 and 2, that is, within the ranges where the sum of the lengths Lc of the one face in the opposite faces 1a, 1b of the piezoelectric substrate 1 and the length Wc of the other side of the same is limited within range 2.22 mm$\leq$ $\leq$2.24 mm or 2.34 mm$\leq$ $\leq$2.48 mm and within the ranges where the areas Sc of the opposite faces 1a, 1b are, with respect to the one side, 1.22$\leq$Sc$\leq$1.26 mm² or 1.35$\leq$Sc$\leq$1.538 mm². Further, it is found that the preferable waveform of the fundamental wave is obtained within the range where the lengths Lc of the one sides of the opposite sides 1a, 1b of the piezoelectric substrate 1 is 1.16 mm$\leq$Lc$\leq$1.22 mm, and the lengths Wc of the other sides is 1.18 mm$\leq$Wc$\leq$1.22 mm.

Table 3 shows representative several results of the maximum resonator sharpness Qmax1st, Qmax3rd and the ratio of Qmax1st/Qmax3rd. If a value of the ratio is less than 3, an abnormal vibration is caused and the stability of the frequency of the vibration frequency is worsened. Herein, values of 3 or more could be obtained in the piezoelectric resonators including those not shown in Table 3. That is, with respect to the sizes of the opposite faces 1a, 1b of the piezoelectric substrate 1 within the above mentioned ranges, it is seen that the vibrations of the fundamental wave are steadily available.

TABLE 3

| Sizes of piezolectric substrate | | | Sharpness of maximum resonance | | $\dfrac{Q\ max\ 1st}{Q\ max\ 3rd}$ | Waveform |
|---|---|---|---|---|---|---|
| Length Lc (mm) | Width Wc (mm) | Thickness t(mm) | Fundamental harmonics Qmax1st | Tertiary harmonics Qmax3rd | | |
| 1.06 | 1.16 | 0.501 | 16.73 | 0.21 | 79.67 | ○ |
| 1.08 | 1.16 | 0.501 | 13.16 | 0.33 | 39.88 | ○ |
| 1.24 | 1.16 | 0.501 | 54.93 | 0.97 | 56.63 | ○ |
| 1.06 | 1.18 | 0.501 | 18.99 | 0.80 | 23.74 | Δ |
| 1.18 | 1.18 | 0.501 | 35.02 | 0.88 | 39.8 | ◇ |
| 1.16 | 1.20 | 0.501 | 60.66 | 0.14 | 433.29 | ◇ |
| 1.18 | 1.20 | 0.501 | 77.03 | 0.62 | 124.24 | ◇ |
| 1.20 | 1.20 | 0.501 | 43.27 | 0.08 | 540.88 | ◇ |
| 1.10 | 1.24 | 0.501 | 37.70 | 1.33 | 28.35 | Δ |
| 1.12 | 1.26 | 0.501 | 45.73 | 0.70 | 65.33 | ○ |
| 1.22 | 1.26 | 0.501 | 43.74 | 0.46 | 95.09 | Δ |
| 1.18 | 1.28 | 0.501 | 37.38 | 0.12 | 311.5 | ○ |
| 1.20 | 1.20 | 0.23 | 16.31 | 0.06 | 271.83 | ○ |
| 1.12 | 1.16 | 0.501 | 6.77 | 0.38 | 17.82 | X |
| 1.14 | 1.18 | 0.501 | 41.04 | 1.01 | 40.00 | X |
| 1.06 | 1.26 | 0.501 | 20.24 | 0.54 | 37.48 | X |
| 1.24 | 1.28 | 0.501 | 37.89 | 0.69 | 54.91 | X |

The piezoelectric resonators were produced under the same conditions as mentioned above, excepting that the thickness of the piezoelectric substrate 1 was 0.23 mm, the lengths Lc of the one sides of the opposite faces 1a, 1b were 1.20 mm, and the lengths Wc of the other sides were 1.20 mm. Also with respect to these piezoelectric resonators, the piezoelectric characteristic in the thickness extensional direction was investigated. The investigated results are also shown in Table 3. The waveforms of the fundamental wave are good ○, and the ratio of the maximum resonance sharpness, Qmax1st/Qmax3rd was 3 or more. That is, it is seen that although the thickness of the piezoelectric substrate 1 is changed, if the sizes of the opposite faces 1a, 1b are within the above-mentioned ranges, the vibration of the fundamental wave can be steadily obtained. However, when the thickness of the piezoelectric substrate 1 was made thin, the spuriousness tended to more or less exist.

The piezoelectric resonators were produced under the same conditions as mentioned above, excepting that the thickness of the piezoelectric substrate 1 was 0.501 mm, the lengths Lc of the one sides of the opposite faces 1a, 1b were 1.20 mm, the lengths Wc of the other sides were 1.20 mm, and the sizes of the piezoelectric resonating electrodes 2a, 3a were changed. Table 4 shows the sizes of the vibrating electrodes 2a, 3a of the produced piezoelectric resonators. Herein, the vibrating electrodes 2a, 3a were square, and the lengths Le extended in the extension direction I of the one side in the opposite faces 1a, 1b of the piezoelectric substrate 1 and the length We extended in the vertical direction therewith were changed by 0.1 mm within the range from 1.10 to 0.70 mm. The ratios (Se/Sc) of the area Se of the vibrating electrodes 2a, 3vs. the area Sc in the one of the opposite faces 1a, 1b of the piezoelectric substrate 1 are shown in Table 4.

TABLE 4

| Sizes of oscillation electrode | | | Area ratio Se/Sc | Sharpness of maximum resonance | | $\dfrac{Q\ max\ 1st}{Q\ max\ 3rd}$ | Waveform |
|---|---|---|---|---|---|---|---|
| Le (mm) | We (mm) | Se (mm²) | | Fundamental harmonics Qmax1st | Tertiary harmonics Qmax3rd | | |
| 1.10 | 1.10 | 1.21 | 0.840 | 39.62 | 0.53 | 74.75 | ○ |
| 1.00 | 1.00 | 1.00 | 0.694 | 44.62 | 0.20 | 223.1 | ○ |
| 0.90 | 0.90 | 0.81 | 0.563 | 41.13 | 0.11 | 373.91 | ○ |
| 0.80 | 0.80 | 0.64 | 0.444 | 34.31 | 0.39 | 87.97 | ○ |
| 0.70 | 0.70 | 0.49 | 0.340 | 37.85 | 0.04 | 946.25 | ○ |

Also with respect to these piezoelectric resonators, the piezoelectric characteristic in the thickness extensional direction was investigated. The investigated results are also shown in Table 4. The waveforms of the fundamental wave are good ○, and the ratio of the maximum resonance sharpness, Qmax1st/Qmax3rd was 3 or more. That is, it is seen that although the sizes of the piezoelectric electrodes 2a, 3a is changed, if the sizes of the opposite faces 1a, 1b are within the above mentioned ranges, the vibration of the fundamental wave can be steadily obtained.

From these results, it is found that the vibration of the fundamental wave can be utilized in that the piezoelectric substrate 1 is composed of the bismuth layer compound containing, as the main elements, bismuth-strontium-titanium-oxygen, and in that the sum of the lengths Lc of the one side in the opposite faces 1a, 1b of the piezoelectric substrate 1 and the length Wc of the other side of the same is limited within range 2.22 mm$\leq$$\leq$2.24 mm or 2.34 mm$\leq$$\leq$2.48 mm and the areas Sc of the opposite faces 1a, 1b are, with respect to the one side, 1.22$\leq$Sc$\leq$1.26 mm² or 1.35$\leq$Sc$\leq$1.538 mm². Further, it is found that the preferable waveform of the fundamental wave is obtained within the range where the lengths Lc of the one sides of the opposite sides 1a, 1b of the piezoelectric substrate 1 is 1.16 mm≦Lc≦1.22 mm, and the lengths Wc of the other sides is 1.18 mm≦Wc≦1.22 mm.

In the above mentioned Examples, explanation has been made to the case that the piezoelectric substrate 1 was composed with the bismuth layer compound containing bismuth-strontium-titanium-lanthanum-manganese, but similar results may be obtained though composing the piezoelectric substrate 1 with the compound of another bismuth layer compound. In addition, similar results may be provided though using the piezoelectric material of the effective Poisson's ratio being less than 1/3 other than the bismuth layer compound.

The invention has been explained with reference to the practiced embodiments and the Examples, but it should be noted that the invention is not limited thereto but variously modified. For example, in the above practiced embodiments and the Examples, the piezoelectric material composing the piezoelectric substrate 1 has been explained by enumerating the actual examples, but as far as the effective Poisson's ratio of the piezoelectric material is less than 1/3, it may be broadly applied.

Second Embodiment

Next, second embodiment of the present invention will be described as follows referring to the accompanying drawings.

Figure 6:
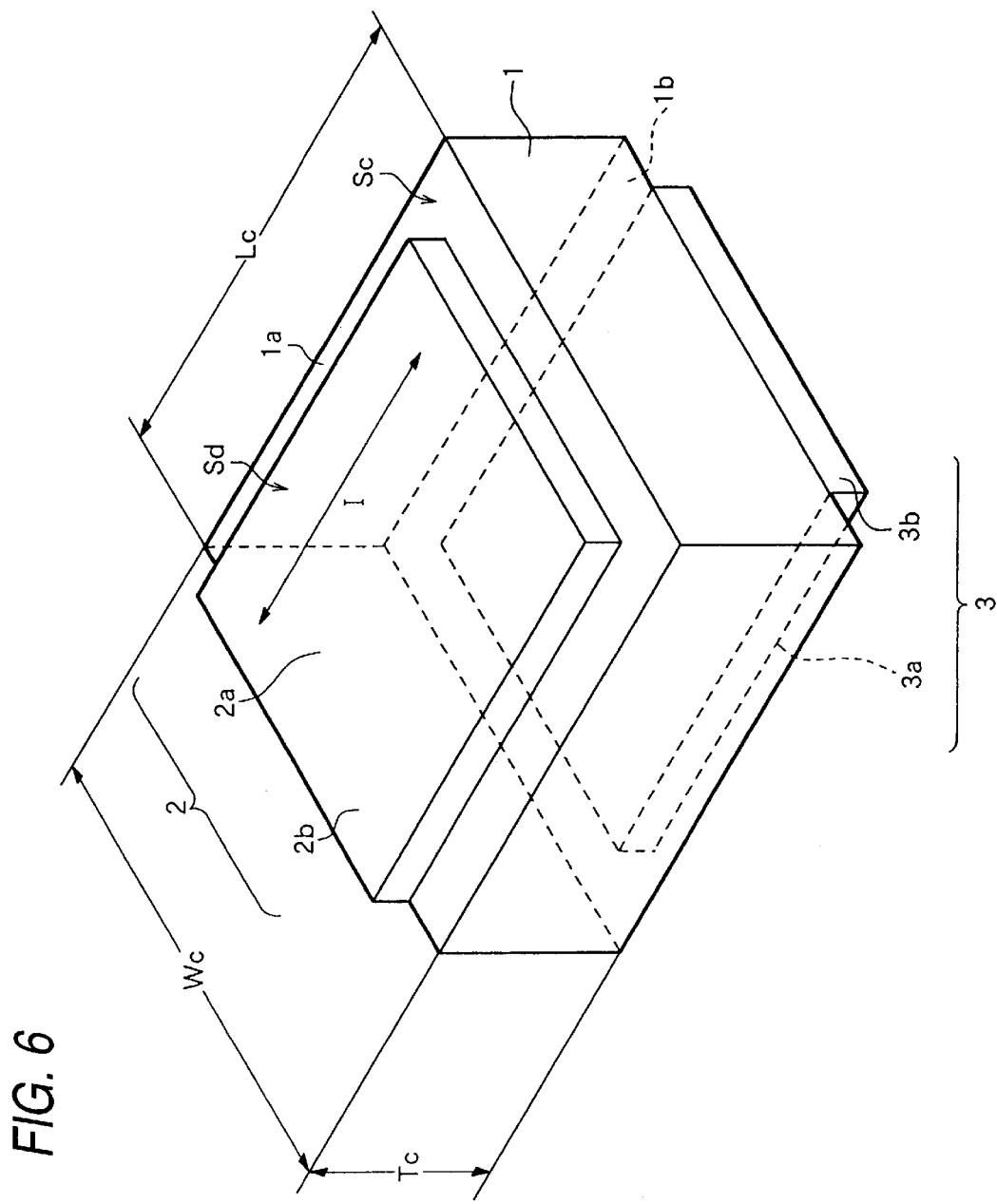
FIG. 6 is a perspective view showing a schematic structure of a piezoelectric resonator relating to one embodiment of the present invention.

FIG. 6 is a perspective view schematically showing a structure of a piezoelectric resonator according to the second embodiments of the invention. This piezoelectric resonator comprises the piezoelectric substrate 1 having a pair of opposite faces 1a, 1b and an effective Poisson's ratio being less than 1/3, and a pair of electrodes 2, 3 provided in correspondence to the opposite faces 1a, 1b of the piezoelectric substrate 1. This structure is similar to that of the first embodiment.

The opposite faces 1a, 1b of the piezoelectric substrate 1 have almost the same shapes such as rectangular respectively. The rectangular shape referred to herein is a substantially sensed shape. Therefore, it is allowed that a corner is somewhat truncated, or the corner is not exactly 90 degrees. The length Lc of one side of the opposite faces 1a, 1b is, as shown in Formula 2-1, limited within the range of the distance between the opposite faces 1a and 1b, that is, 5 times or less of the thickness Tc of the piezoelectric substrate 1. The length Wc of the other side perpendicular with the one side of the opposite faces 1a, 1b, as shown in Formula 2-2, ranges from 0.93 times to 1.07 times of the length Lc of one side.

$Lc \leq 5.0 \times Tc$ (Formula 2-1)

$0.93 \times Lc \leq Wc \leq 1.07 \times Lc$ (Formula 2-2)

In this piezoelectric resonator, the length Lc of one side and the length Wc of the other side Wc of the opposite faces 1a, 1b of the piezoelectric substrate 1 is specified. Although using the piezoelectric material of the effective Poisson's ratio being less than 1/3, it is possible to obtain the preferable waveform and the high resonance sharpness Q value and make use of vibration of the fundamental wave. Incidentally, the length Lc of the one side in the present embodiment is a length of a side extended in the same direction as an extension I of leaders 2b, 3b of later mentioned electrodes 2, 3, while the length Wc of the other side is a length of a side extended in a perpendicular direction therewith. The resonance sharpness Q value is meant by a value where an absolute value of reactance X in impedance is divided with resistance R thereof (Q=|X|/R).

It is preferable that the length Lc of the one side of the opposite faces 1a, 1b is limited within the range of 0.35 times or more of the thickness Tc as shown in a formula 2-3. It is more preferable that the length Lc is limited within the range of 4.3 times or less of the thickness Tc as shown in a formula 2-4, and still more preferable is within the range of 3.2 times or less as shown in a formula 2-5, and especially preferable is within the range of 2.7 times or less as shown in a formula 2-6. On the other hand, the length Wc of the other one side is more preferably from 0.97 times to 1.03 times of the length Lc as shown in a formula 2-7. Because within these ranges, more preferable waveforms are available in the fundamental waves.

$Lc \geq 0.35 \times Tc$ (Formula 2-3)

$Lc \leq 4.3 \times Tc$ (Formula 2-4)

$Lc \leq 3.2 \times Tc$ (Formula 2-5)

$Lc \leq 2.7 \times Tc$ (Formula 2-6)

$0.97 \times Lc \leq Wc \leq 1.03 \times Lc$ (Formula 2-7)

As the piezoelectric material of the effective Poisson's ratio being less than 1/3, the same materials of the first embodiment can be used. Accordingly, the specific description on the materials is omitted here.

An electrode 2 is composed of a metal such as silver (Ag) and has a vibrating electrode 2a and a leader 2b furnished continuously to the vibrating electrode 2a. The vibrating electrode 2a is formed such that the face thereof to contact the piezoelectric substrate 1 is rectangular, and is disposed substantially at the center of the opposite face 1a. The leader 2b is electrically connected to an external source (not shown) via a wire, and is extended from the vibrating electrode 2a to the other one side along the extension I of the piezoelectric substrate 1. An electrode 3 has the same structure as the electrode 2. The vibrating electrode 3a is furnished under the vibrating electrode 2a of the electrode 2 via the piezoelectric substrate 1 in the thickness direction of the piezoelectric substrate 1. A leader 3b is extended from the vibrating electrode 3a in the opposite direction of the leader 2b of the electrode 2. In other words, parts of the electrodes 2, 3 which are over each other in the thickness direction of the piezoelectric substrate 1, are vibrating electrodes 2a, 3a.

Areas of the faces of the vibrating electrodes 2a, 3a to contact the piezoelectric substrate 1, namely, areas Sd of the vibrating substrate 2a, 3a are preferably 6% or more of areas Sc of the opposite faces 1a, 1b of the vibrating substrate 1. If the areas are small, a desirable waveform cannot be obtained. A more preferable range of the areas Sd of the vibrating electrodes 2a, 3a is 17% or more of the areas Sc of the opposite faces 1a, 1b. The areas Sd may be equivalent to areas Sc of the opposite faces 1a, 1b. In such a case, the vibrating electrodes 2a, 3a may also serve as the leaders 2b, 3b.

Explanation has been made to that in the present embodiment, the vibrating electrodes 2a, 3a are rectangular, but the shape is not especially limited, and others such as circular ones are sufficient. Also the shapes of the leaders 2b, 3b are not limited and other shapes will do.

The piezoelectric resonator of the above mentioned structure is manufactured by the similar method in the first embodiment. Accordingly, specific explanation of the producing method is omitted here.

The piezoelectric resonator is actuated as follows.

In this piezoelectric resonator, the leader $2a$, $3a$ of the electrodes 2, 3 are connected to the external source via wires (not shown). When the piezoelectric substrate 1 is applied with voltage via the electrodes 2, 3, thickness extensional vibration is generated. In other words, the vibration is generated in a direction opposite to the opposite faces $1a$, $1b$ of the piezoelectric substrate 1. Herein, the length Lc of one side of the opposite faces $1a$, $1b$ is limited within the range of 5 times or less of the thickness Tc and the length Wc of the other one side is from 0.93 times to 1.07 times of the length Lc. The desirable waveform and the high resonance sharpness Q value can be obtained with respect to the vibration of the fundamental wave, and it is possible to utilize the vibration of the fundamental wave.

As mentioned above, in the piezoelectric resonator of the present embodiment, the length Lc of the one side of the opposite faces $1a$, $1b$ of the piezoelectric substrate 1 is limited within the range of 5 times or less of the thickness Tc. At the same time, the length Wc of the other side is limited within the range from 0.93 times to 1.07 times of the length Lc of the one side. Therefore, even if the piezoelectric substrate 1 is composed with the piezoelectric material of the effective Poisson's ratio being less than 1/3, the desirable waveform and the high resonance sharpness Q value can be obtained with respect to the vibration of the fundamental wave. Thus, it is possible to utilize the vibration of the fundamental wave.

Therefore, the damping is not required, and the high resonance sharpness Q value can be obtained in comparison with the prior art utilizing the high harmonics. Consequently, stable vibration can be easily provided. It is accordingly possible to widely put to practice the piezoelectric resonator using the piezoelectric material without containing lead, so that preservation of the environment can be secured. The piezoelectric resonator can be made small sized in response to small sized elements.

In particular, it is preferable that the length Lc of the one side is limited within the range of 4.3 times or less of the thickness Tc, and more preferable is within the range of 3.2 times or less, and especially preferable is within the range of 2.7 times or less. Further, the length Wc of the other one side is from 0.97 times to 1.03 times of the length Lc. Consequently, the desirable waveform and the high resonance sharpness Q value can be obtained with respect to the vibration of the fundamental wave.

Further, if the areas Sd of the vibrating electrodes $2a$, $3a$ are 6% or more of the areas Sc of the opposite faces $1a$, $1b$, or if being more preferably 17% or more of the areas Sc, the more desirable waveform can be obtained.

EXAMPLE 2

Specific explanation of the second embodiment will be made to actual examples of the invention.

Examples 2-1 to 2-7

As the starting material, the raw material powder was used of bismuth oxide ($Bi_2O_3$), lanthanum oxide ($La_2O_3$), titanium oxide ($TiO_2$), strontium carbonate ($SrCO_3$) and manganese carbonate ($MnCO_3$), weighed to provide a composition of $(Sr_{0.9}La_{0.1}) Bi_4Ti_4O_{15}$, and manganese carbonate was weighed to be 0.5 mass % for $(Sr_{0.9}La_{0.1}) Bi_4Ti_4O_{15}$. The weighed powder raw material was subjected to the ball mill mixture with zirconia ball in the pure water for about 15 hours. The mixed raw material powder was fully dried and calcined at 800° C. by pressing. Thereafter, the calcined material was again subjected to the ball mill pulverization, dried and pelletized by adding polyvinyl alcohol as the binder of an appropriate amount. After pelletization, the pelletized powder was formed in a thin plate of 20 mm of length×20 mm of width×about 1.5 mm of thickness under pressure of $2 \times 10^8$ Pa by the uniaxial press molding machine. Thereafter, the binder was volatilized from the formed body by a heat treatment, and a real sintering was carried out at 1200° C. Thus, the sintered body of the bismuth layer compound containing $SrBi_4Ti_4O_{15}$ crystal was obtained.

After the sintered body was obtained, it was ground by the lapping machine to produce the base plate. Thickness of the base plates was changed in Examples 2-1 to 2-7 and adjusted such that the thickness Tc of the piezoelectric substrates was as shown in Table 5. The base plates were formed with the electrodes for polarization and immersed in the silicon oil at 250° C. and applied with electric field of 10 kV/mm for one minute. After the polarization, the polarizing electrodes were removed, and the base plates were performed with the dicing, and the faces from which the polarizing electrodes were removed were made the opposite faces $1a$, $1b$ to form the piezoelectric substrate 1. The opposite faces $1a$, $1b$ were rectangular, and the length Lc of the one side and the length Wc of the other side were both 1.2 mm. Table 5 shows the length Lc, Wc of the opposite faces $1a$, $1b$ and the relation with the thickness Tc in the Examples 2-1 to 2-7.

TABLE 5

| | Thickness Tc (mm) | Relation between side lengths Lc, Wc and thickness Tc |
|---|---|---|
| Example 2-1 | 0.9 | Lc, Wc = 1.3 × Tc |
| Example 2-2 | 0.643 | Lc, Wc = 1.87 × Tc |
| Example 2-3 | 0.563 | Lc, Wc = 2.13 × Tc |
| Example 2-4 | 0.45 | Lc, Wc = 2.67 × Tc |
| Example 2-5 | 0.375 | Lc, Wc = 3.2 × Tc |
| Example 2-6 | 0.321 | Lc, Wc = 3.74 × Tc |
| Example 2-7 | 0.281 | Lc, Wc = 4.27 × Tc |
| Comparative example 1 | 0.188 | Lc, Wc = 6.38 × Tc |

After the piezoelectric substrate 1 was made, it was deposited on the opposite faces $1a$, $1b$ thereof with silver electrodes 2, 3 respectively. The vibrating electrodes $2a$, $3a$ of the electrodes 2, 3 were rectangular, and the sizes were 1.0 mm in the one side and 0.9 mm in the other one side perpendicular therewith. The piezoelectric resonators in the Examples 2-1 to 2-7 were produced thereby under the same conditions excepting that the thickness Tc of the piezoelectric substrate 1 was different.

Figure 7:
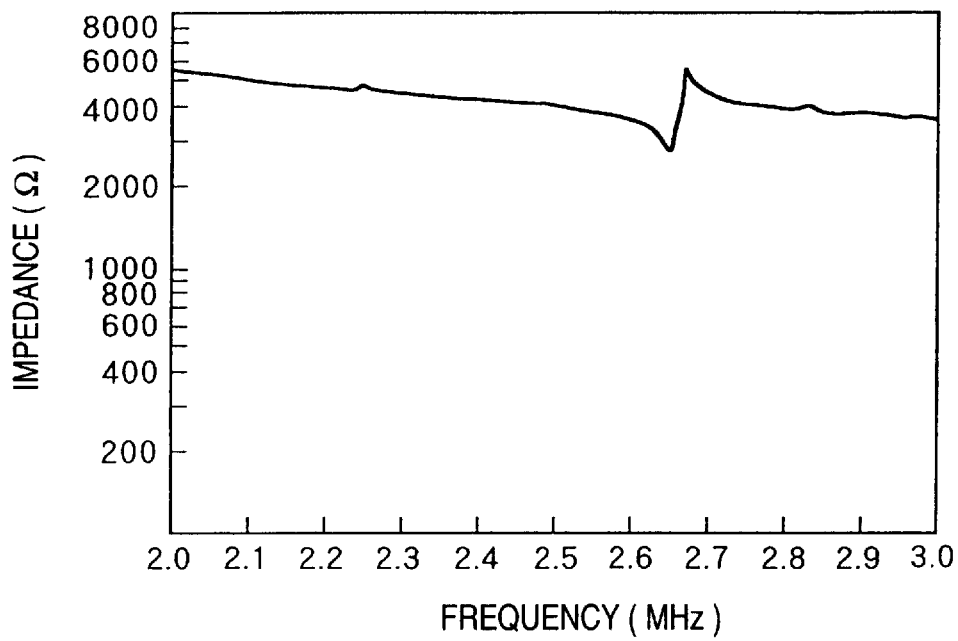
FIG. 7 is a view showing an impedance characteristic of a piezoelectric resonator of Example 2-1.
Figure 8:
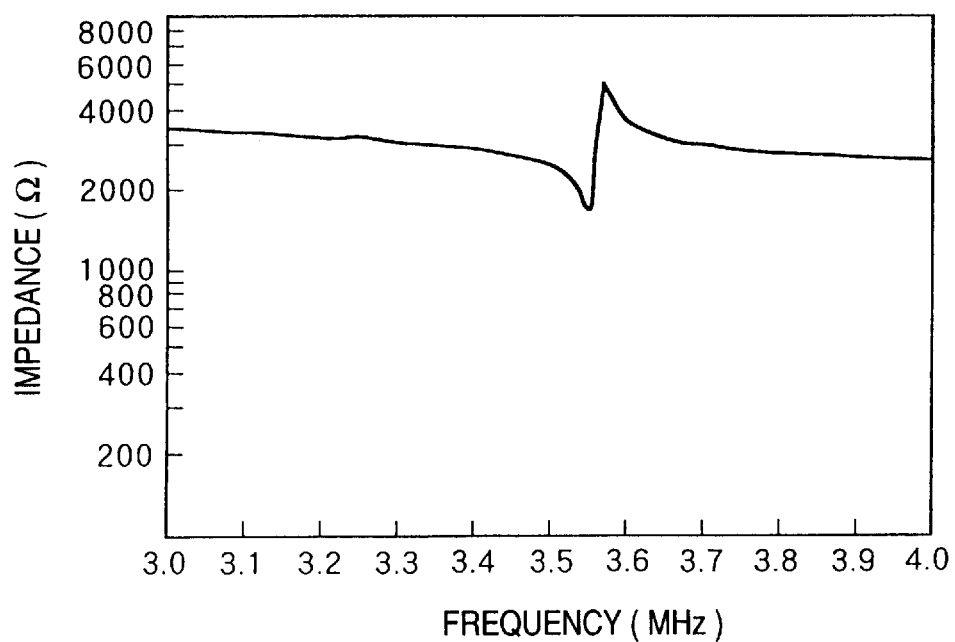
FIG. 8 is a view showing an impedance characteristic of a piezoelectric resonator of Example 2-2.
Figure 9:
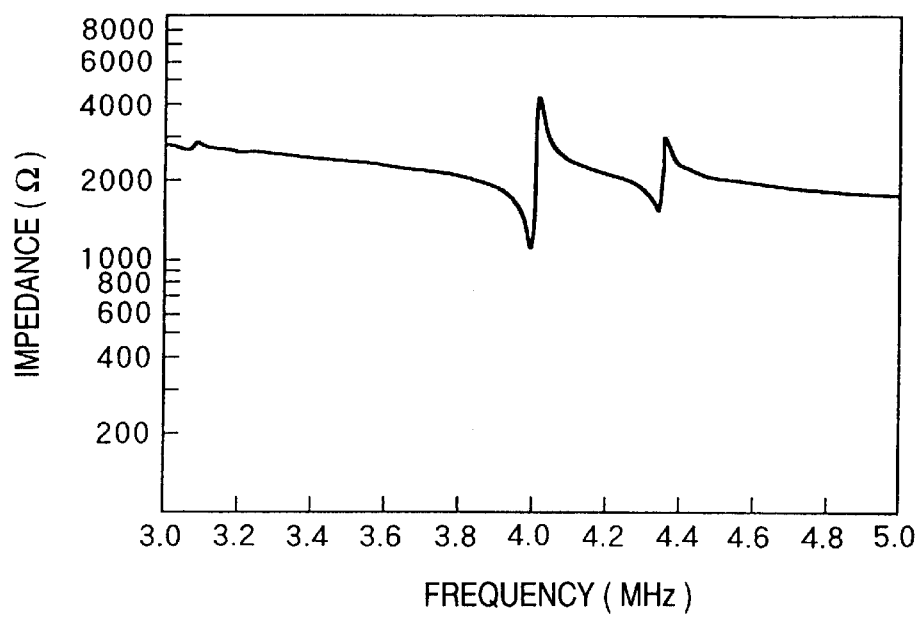
FIG. 9 is a view showing an impedance characteristic of a piezoelectric resonator of Example 2-3.

The thus obtained piezoelectric resonators of the Examples 2-1 to 2-7 were left at room temperature for 24 hours, and the piezoelectric characteristics in the thickness extensional direction were investigated by an impedance analyzer. As the piezoelectric characteristic values, the impedance characteristics were measured. From these measured results, the evaluations were made on the waveforms of main vibrating parts in the thickness extensional fundamental waves. The evaluations of the waveforms were judged by presence or absence of spuriousness between the resonance frequency and the anti-resonance frequency and in the range of 0.15% or thereabout of the frequencies. The result of the Example 2-1 is shown in FIG. 7, the result of the Example 2-2 is shown in FIG. 8, that of the Example 2-3 is shown in FIG. 9, that of the Example 2-4 is in FIG. 10, that of the Example 2-5 is in FIG. 11, that of the Example 2-6 is in FIG. 12, and that of the Example 2-7 is in FIG. 13, respectively. In FIGS. 7 to 13, the vertical axis is the impedance Imp ( ) and the lateral axis is the frequency Freq (MHz).

Figure 10:
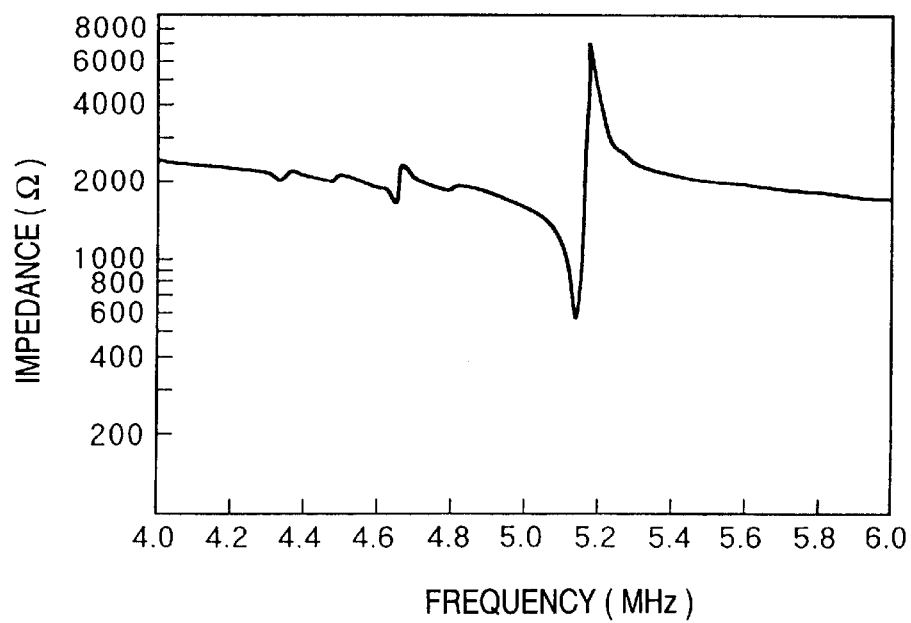
FIG. 10 is a view showing an impedance characteristic of a piezoelectric resonator of Example 2-4.
Figure 11:
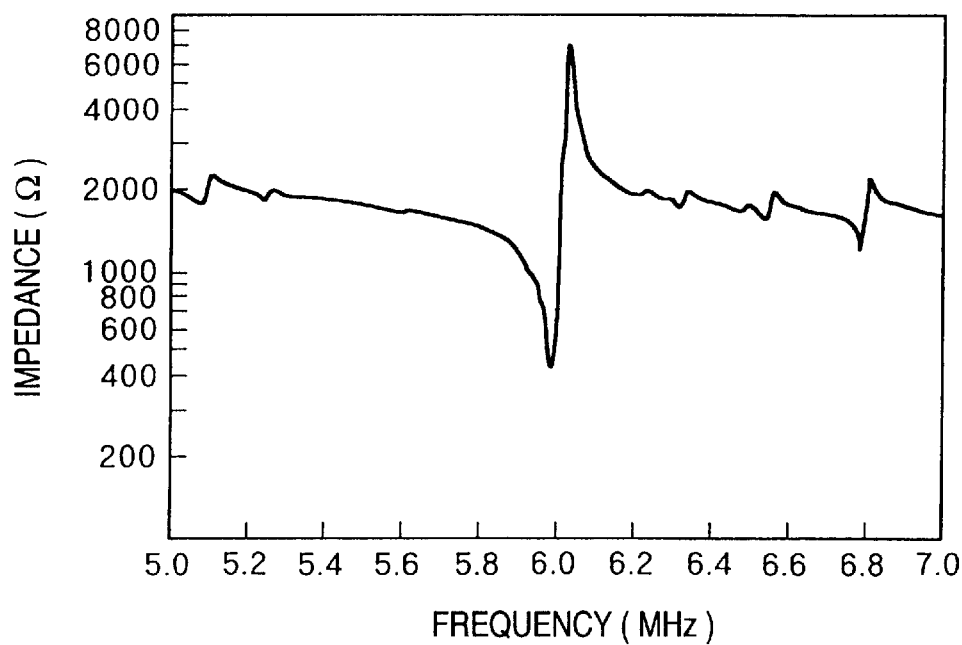
FIG. 11 is a view showing an impedance characteristic of a piezoelectric resonator of Example 2-5.
Figure 12:
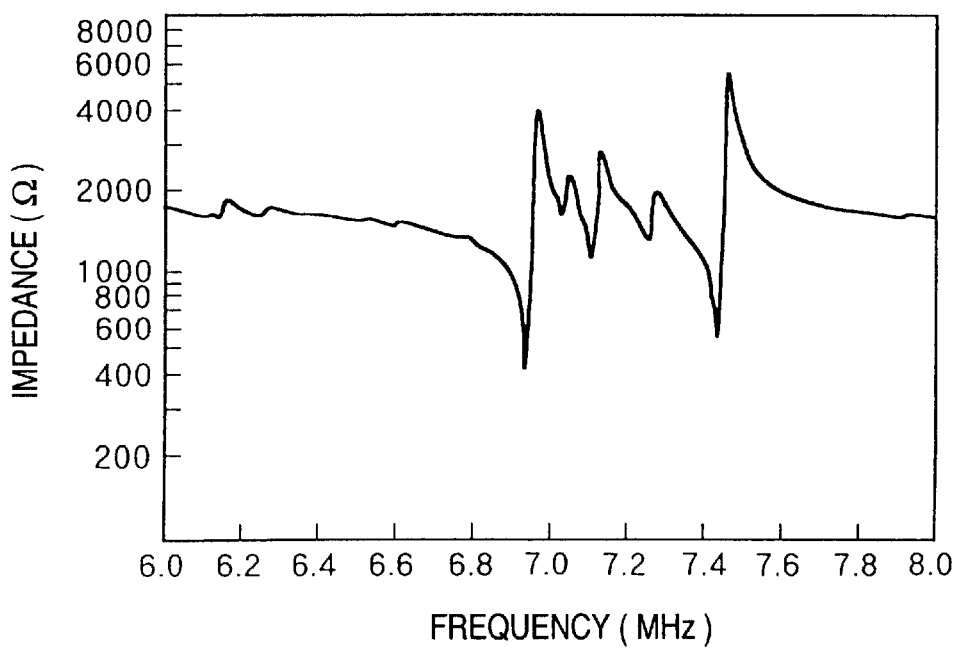
FIG. 12 is a view showing an impedance characteristic of a piezoelectric resonator of Example 2-6.
Figure 13:
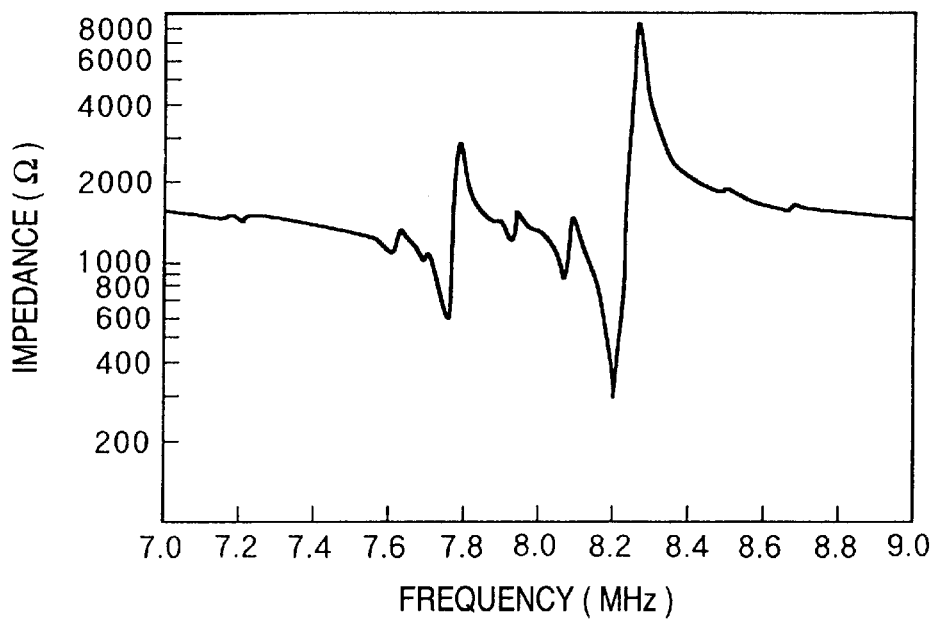
FIG. 13 is a view showing an impedance characteristic of a piezoelectric resonator of Example 2-7.
Figure 14:
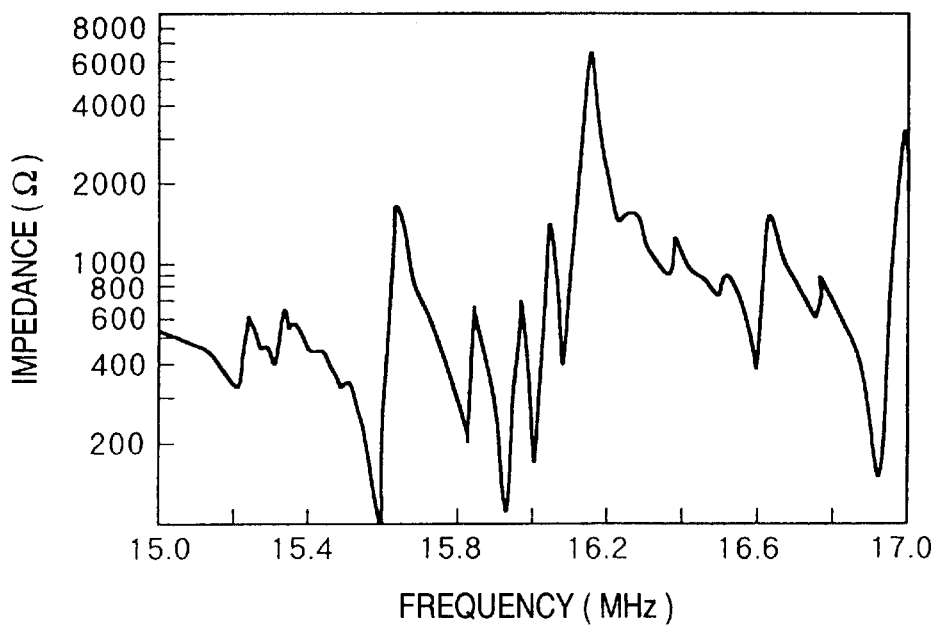
FIG. 14 is a view showing an impedance characteristic of a piezoelectric resonator of Comparative Example 2-1.

As the Comparative Example 2-1 to the Examples 2-1 to 2-7, the piezoelectric resonator was made under the same conditions as the Examples 2-1 to 2-7 excepting that the thickness of the piezoelectric substrate was 0.188 mm. Table 5 shows the relation between the thickness of the piezoelectric substrate and the lengths of the sides of the opposite faces. Also in the Comparative Example 2-1, the impedance characteristic was measured as the Examples 2-1 to 2-7. FIG. 10 shows the result of the Comparative Example 2-1. The vertical axis and the lateral axis are the same as those of FIGS. 7 to 13.

As seen from FIGS. 7 to 14, in the Examples 2-1 to 2-4, the best waveforms were obtained without the presence of spuriousness in the main vibrating part. In the Example 2-5, the excellent waveform was obtained though the spuriousness existed a little in the main vibrating part. In the Examples 2-6 and 2-7, the usable good waveforms were obtained though the spuriousness somewhat existed in the main vibrating part. On the other hand, in the Comparative Example 2-1, much spuriousness exists in the main vibrating part, the waveforms impossible to use was obtained.

That is, it was found that if the lengths Lc, Wc of the sides of the opposite faces 1a, 1b of the piezoelectric substrate 1 were made 5 times or less of the thickness Tc thereof, vibration of the fundamental wave could be used. Further it was found that if the lengths Lc, Wc were 3.2 times or less of the thickness Tc, the better waveform of the fundamental wave was obtained, and if the lengths Lc, Wc were 2.7 times or less of the thickness Tc, the especially excellent waveform of the fundamental wave was obtained.

Examples 2-8 to 2-15

The relation between the lengths Lc, Wc of the sides of the opposite faces 1a, 1b of the piezoelectric substrate 1 was fixed, and the piezoelectric resonators were produced under the same conditions as in the Examples 2-1 to 2-7, excepting that the lengths Lc, Wc and the thickness Tc were varied in the Examples 2-8 to 2-15 as shown in Table 6. At that time, the length Lc of the one sides of the opposite faces 1a, 1b and the length Wc of the other one sides were the same, and the lengths Lc, Wc of the sides were 2.4 times of the thickness Tc. The sizes of the vibrating electrodes 2a, 3a were as shown in Table 6.

TABLE 6

|  | Side lengths Lc, Wc (mm) | Thickness Tc (mm) | Vibration electrode (mm) one side × perpendicular side |
| --- | --- | --- | --- |
| Example 2-8 | 2.16 | 0.9 | 1.8 × 1.62 |
| Example 2-9 | 1.54 | 0.64 | 1.29 × 1.16 |
| Example 2-10 | 1.35 | 0.56 | 1.13 × 1.01 |
| Example 2-11 | 1.08 | 0.45 | 0.9 × 0.81 |
| Example 2-12 | 0.9 | 0.38 | 0.75 × 0.68 |
| Example 2-13 | 0.77 | 0.32 | 0.64 × 0.58 |
| Example 2-14 | 0.67 | 0.28 | 0.56 × 0.51 |
| Example 2-15 | 0.45 | 0.19 | 0.38 × 0.34 |

Figure 15:
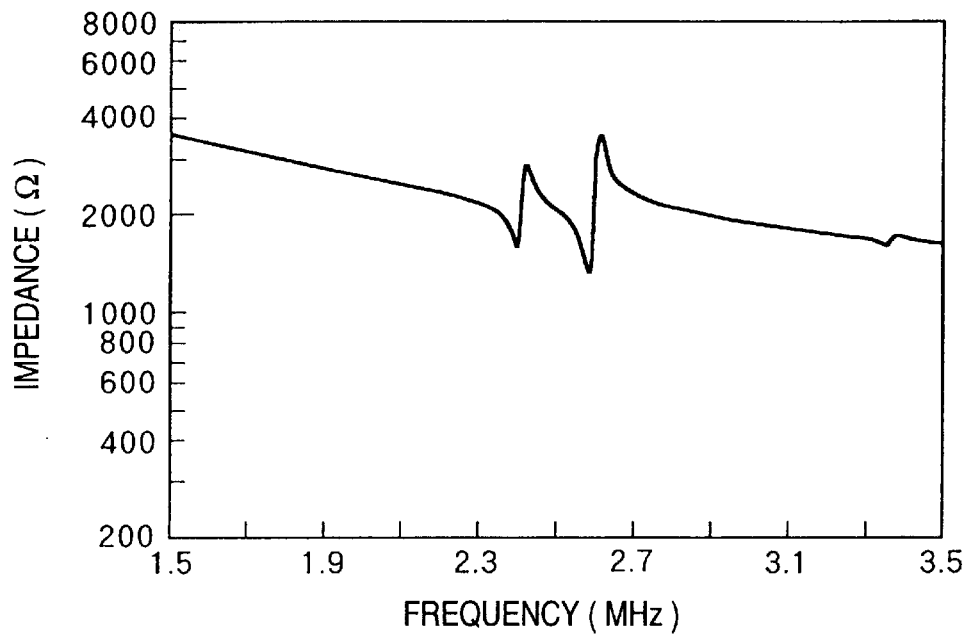
FIG. 15 is a view showing an impedance characteristic of a piezoelectric resonator of Example 2-8.
Figure 16:
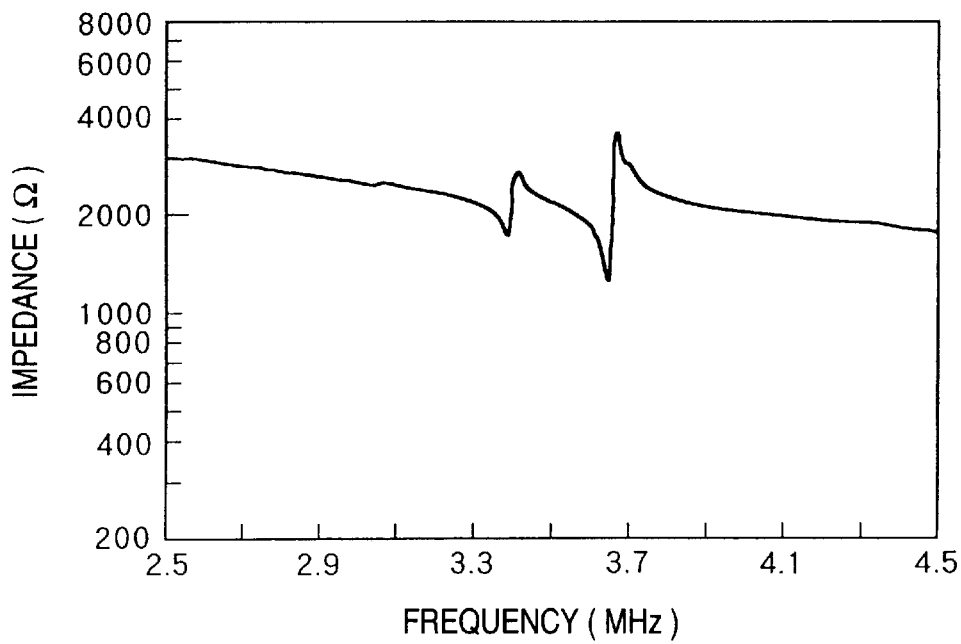
FIG. 16 is a view showing an impedance characteristic of the piezoelectric resonator of Example 2-9.
Figure 17:
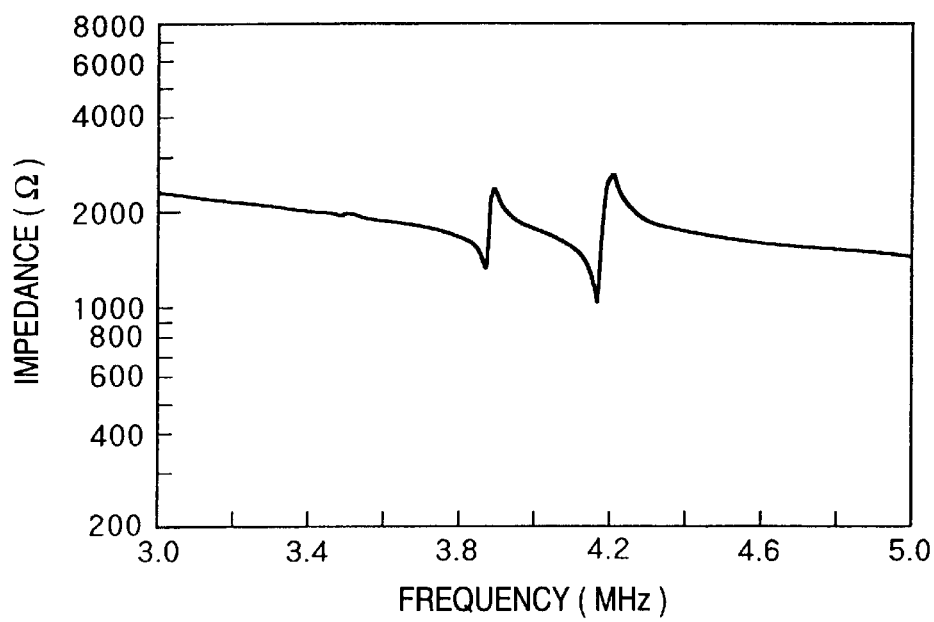
FIG. 17 is a view showing an impedance characteristic of a piezoelectric resonator of Example 2-10.
Figure 18:
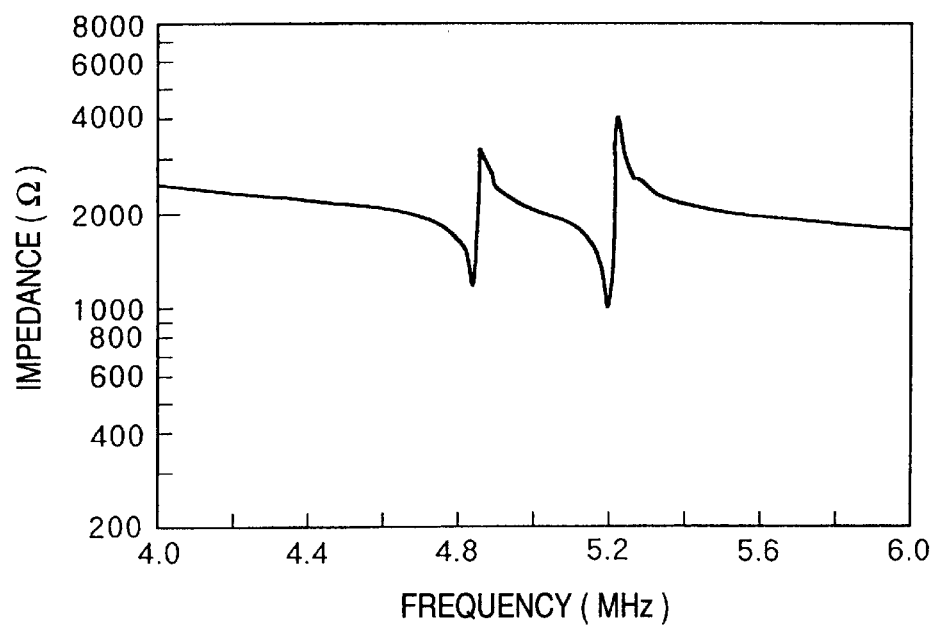
FIG. 18 is a view showing an impedance characteristic of a piezoelectric resonator of Example 2-11.
Figure 19:
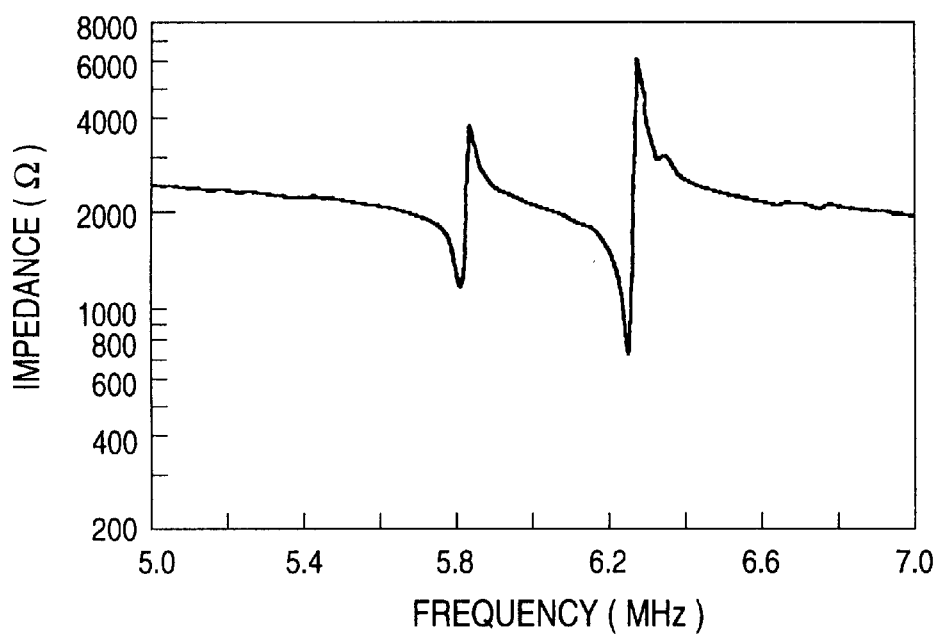
FIG. 19 is a view showing an impedance characteristic of a piezoelectric resonator of Example 2-12.
Figure 20:
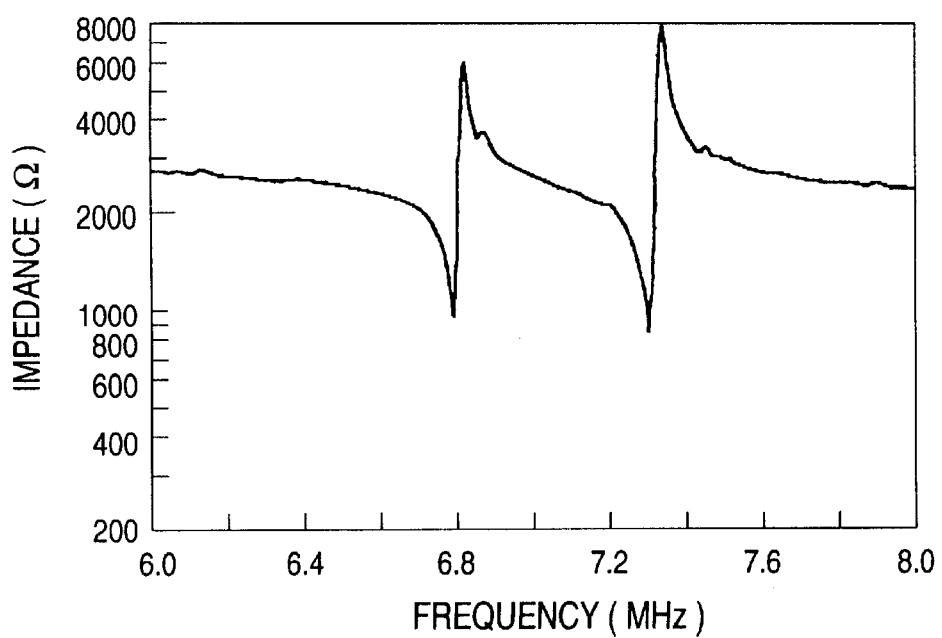
FIG. 20 is a view showing an impedance characteristic of a pizoelectric resonator of Example 2-13.
Figure 21:
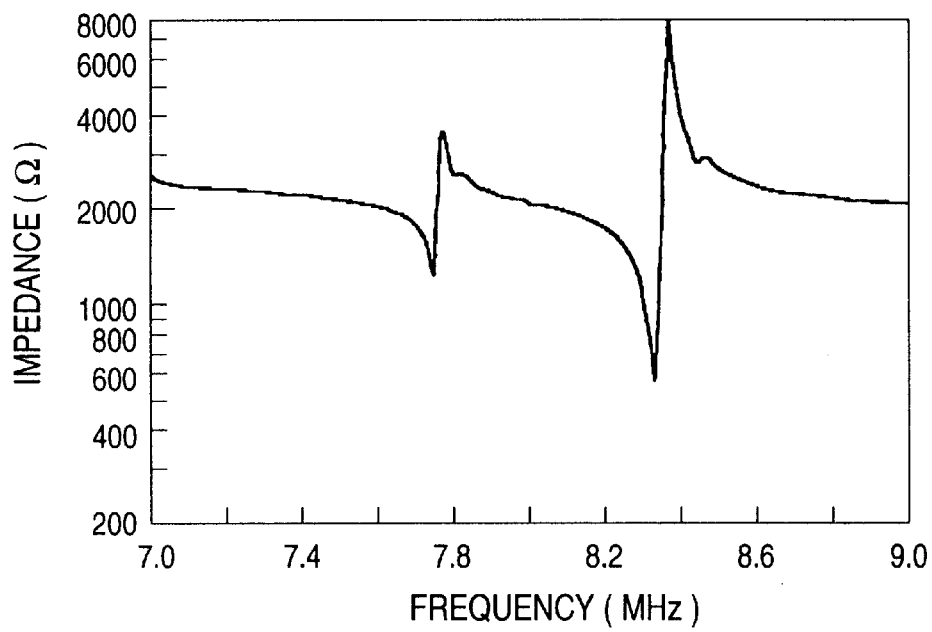
FIG. 21 is a view showing an impedance characteristic of a piezoelectric resonator of Example 2-14.
Figure 22:
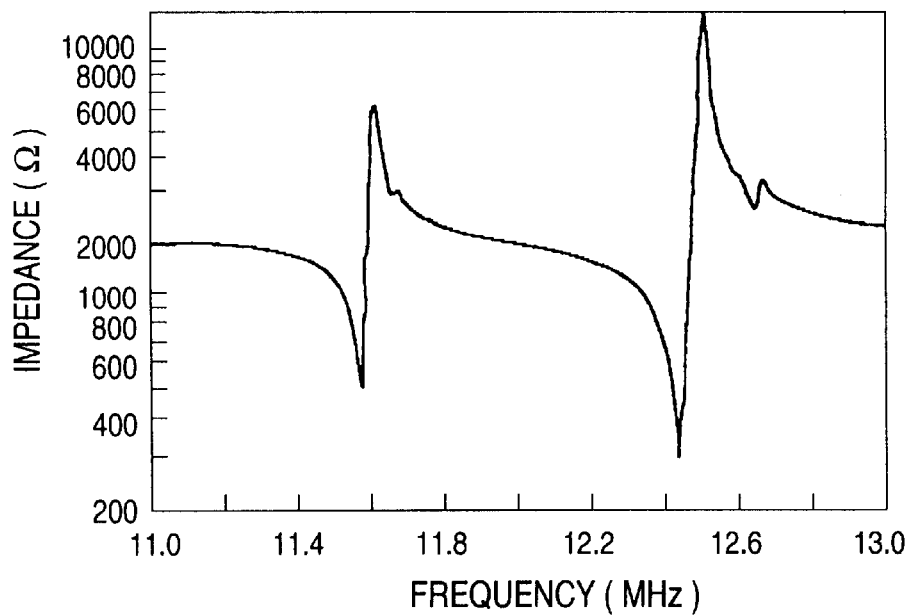
FIG. 22 is a view showing an impedance characteristic of a piezoelectric resonator of Example 2-15.

With respect to the obtained piezoelectric resonators of the Examples 2-8 to 2-15, the piezoelectric characteristics in the thickness extensional direction were investigated in the same manners in the Examples 2-1 to 2-7. The result of the Example 2-8 is shown in FIG. 15, the result of the Example 2-9 is shown in FIG. 16, that of the Example 2-10 is shown in FIG. 17, that of the Example 2-11 is in FIG. 18, that of the Example 2-12 is in FIG. 19, that of the Example 2-13 is in FIG. 20, that of the Example 2-14 is in FIG. 21, and that of the Example 2-15 is in FIG. 22, respectively. The vertical axis and the lateral axis of FIGS. 15 to 22 are the same as in FIGS. 7 to 13.

As seen from FIGS. 15 to 22, in each of the Examples 2-8 to 2-15, the best waveforms were obtained without the presence of spuriousness in the main vibrating part. Namely, if the lengths Lc, Wc of the sides of the opposite faces 1a, 1b were 5 times or less of the thickness Tc, the vibration of the fundamental wave could be used, irrespective of the sizes of the piezoelectric substrate 1.

Examples 2-16 to 2-19

The thickness Tc of the piezoelectric substrate 1 was fixed to be 0.5 mm, and the piezoelectric resonators were produced under the same conditions as in the Example 2-1, excepting that the length Lc of the one side and the length Wc of the other one side were varied in the Examples 2-16 to 2-19 as shown in Table 7. The relation between the length Lc of the one side and the length Wc of the other one side are also shown in Table 7.

TABLE 7

|  | One side length Lc (mm) | Other side length Wc (mm) | Relationship between one side length Lc and other side length Wc |
| --- | --- | --- | --- |
| Example 2-16 | 1.20 | 1.28 | Wc = 1.07 × Lc |
| Example 2-17 | 1.20 | 1.16 | Wc = 0.97 × Lc |
| Example 2-18 | 1.14 | 1.20 | Wc = 1.05 × Lc |
| Example 2-19 | 1.24 | 1.20 | Wc = 0.97 × Lc |
| Comparative Example 2-2 | 1.20 | 1.30 | Wc = 1.08 × Lc |
| Comparative Example 2-3 | 1.20 | 1.10 | Wc = 0.92 × Lc |
| Comparative Example 2-4 | 1.10 | 1.20 | Wc = 1.09 × Lc |
| Comparative Example 2-5 | 1.32 | 1.20 | Wc = 0.91 × Lc |

Figure 23:
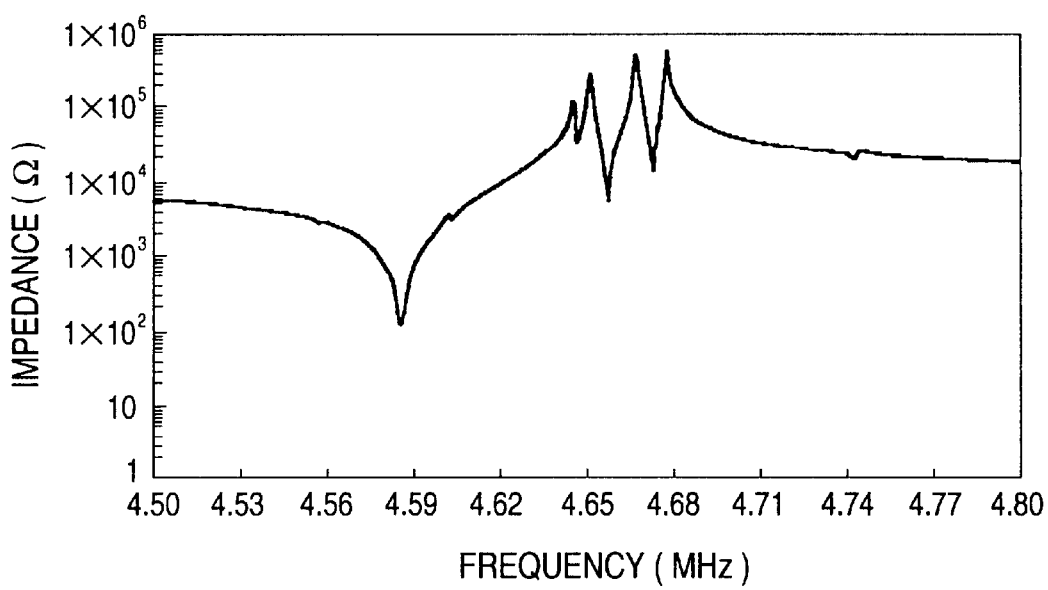
FIG. 23 is a view showing an impedance characteristic of a piezoelectric resonator of Example 2-16.
Figure 24:
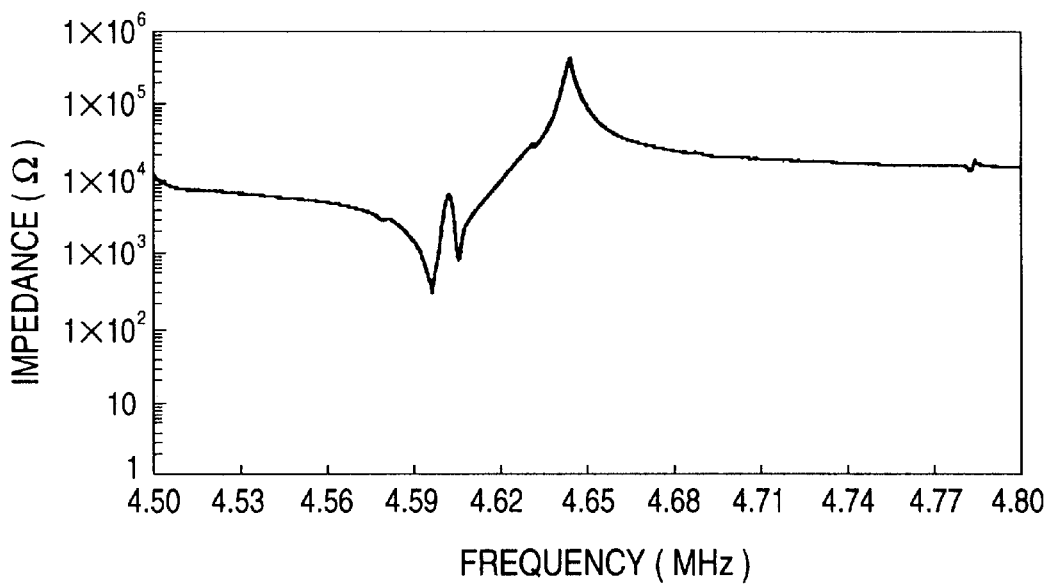
FIG. 24 is a view showing an impedance characteristic of a piezoelectric resonator of Example 2-17.
Figure 25:
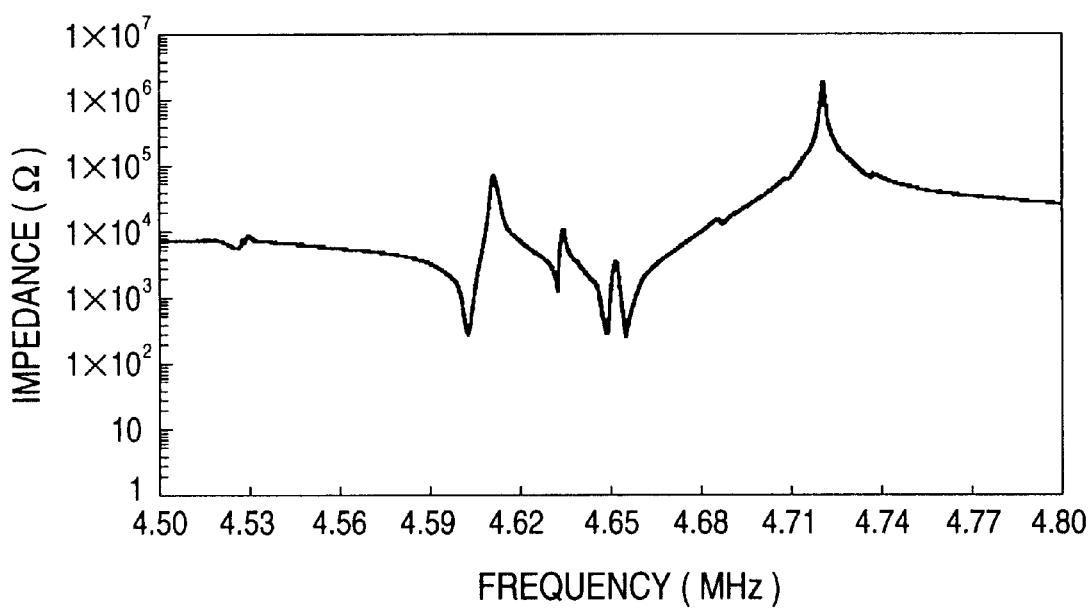
FIG. 25 is a view showing an impedance characteristic of a piezoelectric resonator of Example 2-18.
Figure 26:
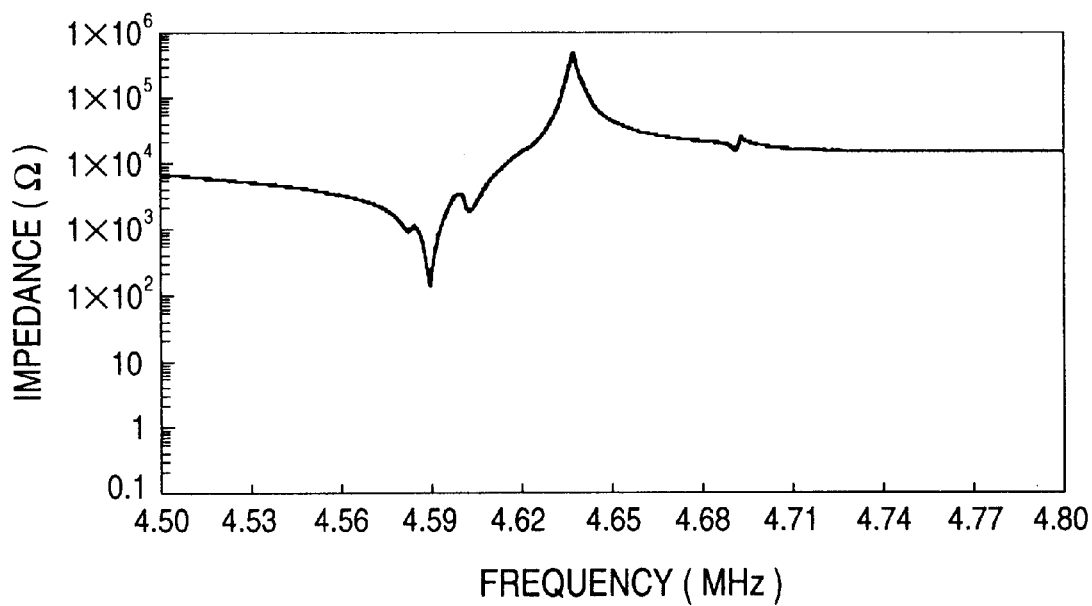
FIG. 26 is a view showing an impedance characteristic of a piezoelectric resonator of Example 2-19.

With respect to the obtained piezoelectric resonators of the Examples 2-16 to 2-19, the piezoelectric characteristics in the thickness extensional direction were investigated in the same manners in the Examples 2-1 to 2-7. The result of the Example 2-16 is shown in FIG. 23, the result of the Example 2-17 is shown in FIG. 24, that of the Example 2-18 is shown in FIG. 25, and that of the Example 2-19 is in FIG. 26, respectively. The vertical axis and the lateral axis of FIGS. 23 to 26 are the same as in FIGS. 7 to 13.

Figure 27:
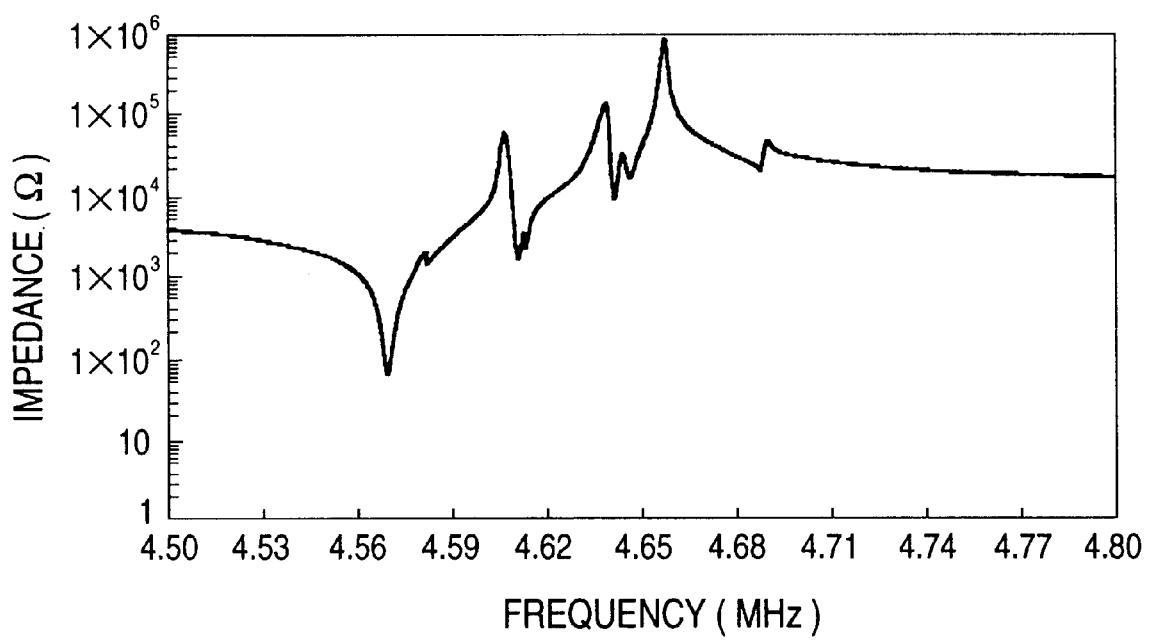
FIG. 27 is a view showing an impedance characteristic of a piezoelectric resonator of Comparative Example 2-2.
Figure 28:
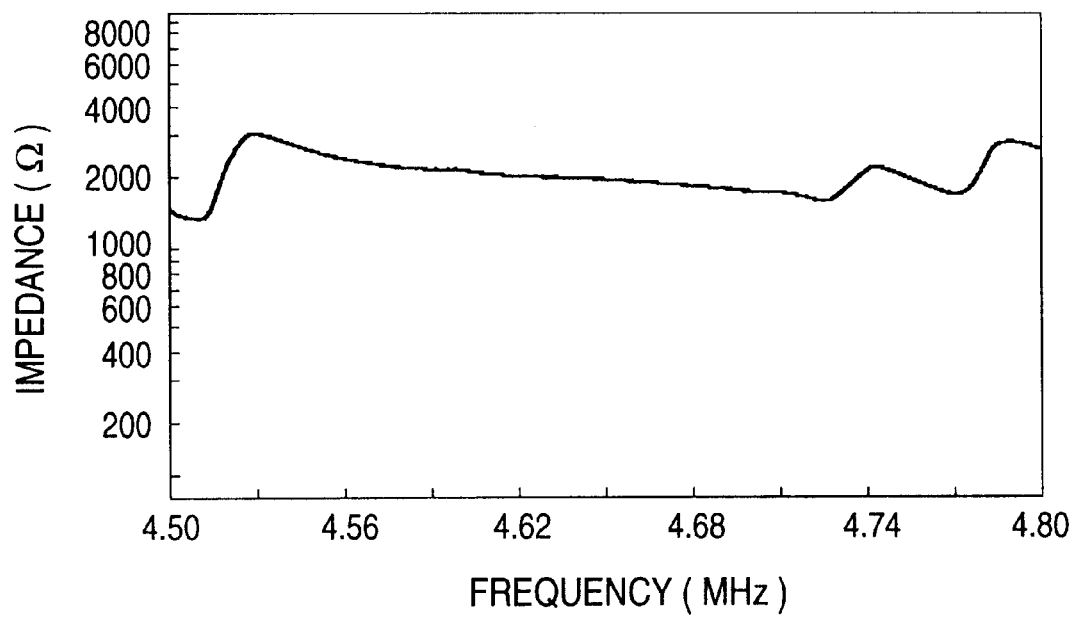
FIG. 28 is a view showing an impedance characteristic of a piezoelectric resonator of Comparative Example 2-3.
Figure 29:
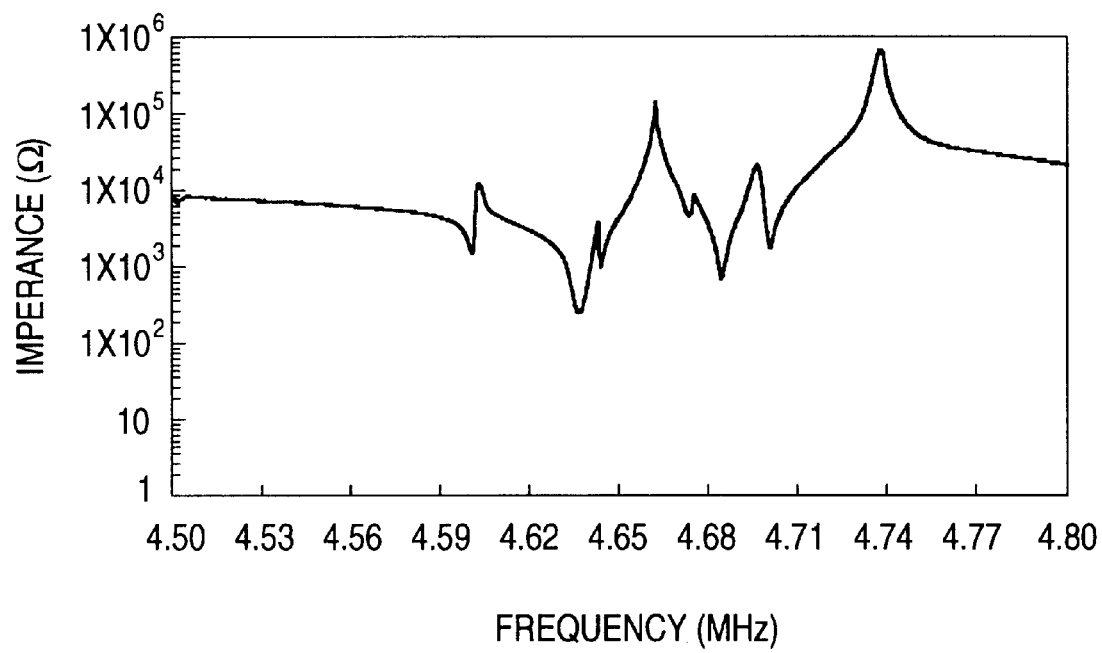
FIG. 29 is a view showing an impedance characteristic of a piezoelectric resonator of Comparative Example 2-4.
Figure 30:
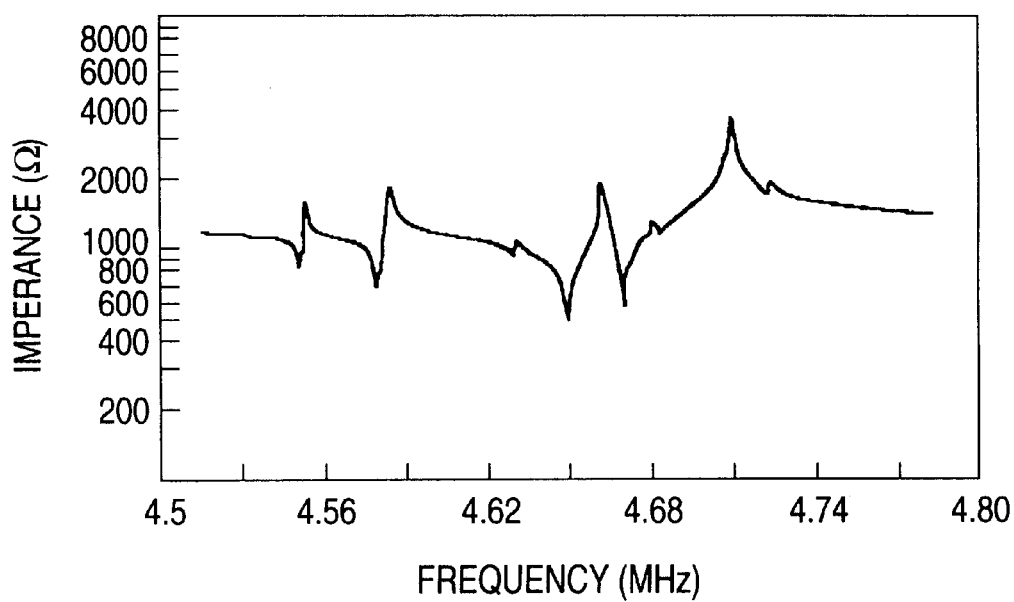
FIG. 30 is a view showing an impedance characteristic of a piezoelectric resonator of Comparative Example 2-5.

As the Comparative Examples 2-2 to 2-5 to the Examples 2-16 to 2-19, the piezoelectric resonators were made under the same conditions as the Examples 2-16 to 2-19 excepting that the length of the one side and the length of the other one side were changed as shown in Table 7. Also with respect to these Comparative Examples 2-2 to 2-5, the piezoelectric characteristics were investigated as the Examples 2-16 to 2-19. The result of the Comparative Example 2-2 is shown in FIG. 27, the result of the Comparative Example 2-3 is shown in FIG. 28, that of he Comparative Example 2-4 is in FIG. 29, and that of the Comparative Example 2-5 is in FIG. 30, respectively. The vertical axis and the lateral axis in FIGS. 27 to 30 are the same as those of FIGS. 7 to 13.

As seen from FIGS. 23 to 30, in the Examples 2-16 to 2-19, the usable good waveforms were obtained though the spuriousness existed more or less in the main vibrating part. On the other hand, in the Comparative Examples 2-2 to 2-5, much spuriousness exists in the main vibrating part, and the waveforms impossible to use were obtained. Namely, it was found that if the length Wc of the other one side is from 0.93 times to 1.07 times of the length Lc of the one side of the opposite faces 1a, 1b of the piezoelectric substrate 1, the vibration of the fundamental wave could be used.

In the above mentioned Examples, explanation has been made to the case that the piezoelectric substrate 1 was composed with the bismuth layer compound containing bismuth-strontium-titanium-lanthanum-manganese, but similar results may be obtained though composing the piezoelectric substrate 1 with the bismuth layer compound containing other bismuth. In addition, similar results may be provided though using the piezoelectric material of the effective Poisson's ratio being less than 1/3 other than the bismuth layer compound.

The present invention has been explained with reference to the embodiment and the Examples, but it should be noted that the invention is not limited thereto but variously modified. For example, in the above embodiment and the Examples, the piezoelectric material composing the piezoelectric substrate 1 has been explained by enumerating the actual examples, but as far as the effective Poisson's ratio of the piezoelectric material is less than 1/3, it may be broadly applied.

The above practiced embodiments have been explained in that the length Lc of the one side of the opposite faces 1a, 1b of the piezoelectric substrate 1 is a length of extension in the extending direction I of the leaders 2b, 3b of the electrodes 2, 3, but either length of the perpendicular two sides may be made Lc.

Third Embodiment

Figure 31:
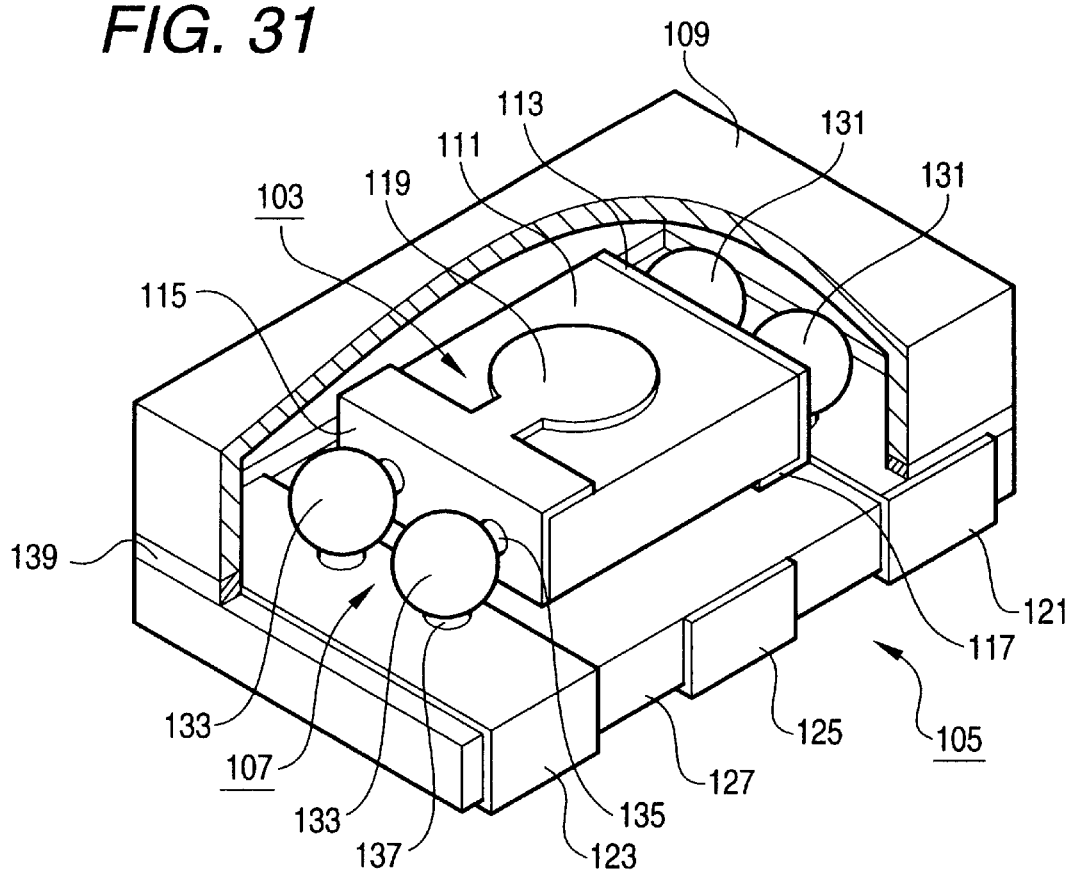
FIG. 31 is a perspective view of a piezoelectric resonating part of the invention shown as assembled and partly broken to show the interior thereof.
Figure 32:
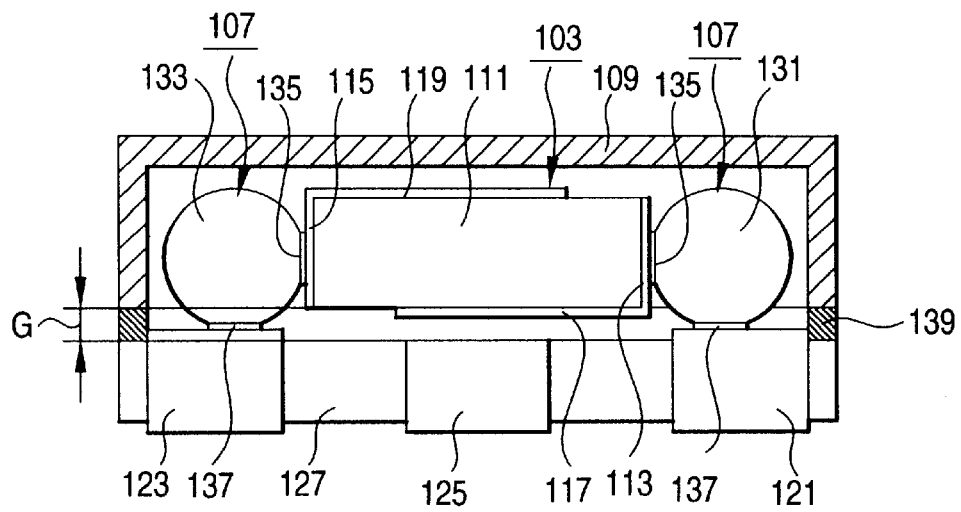
FIG. 32 is an enlarged side view of the piezoelectric resonating part of FIG. 1 partly broken to show the interior thereof.
Figure 33:
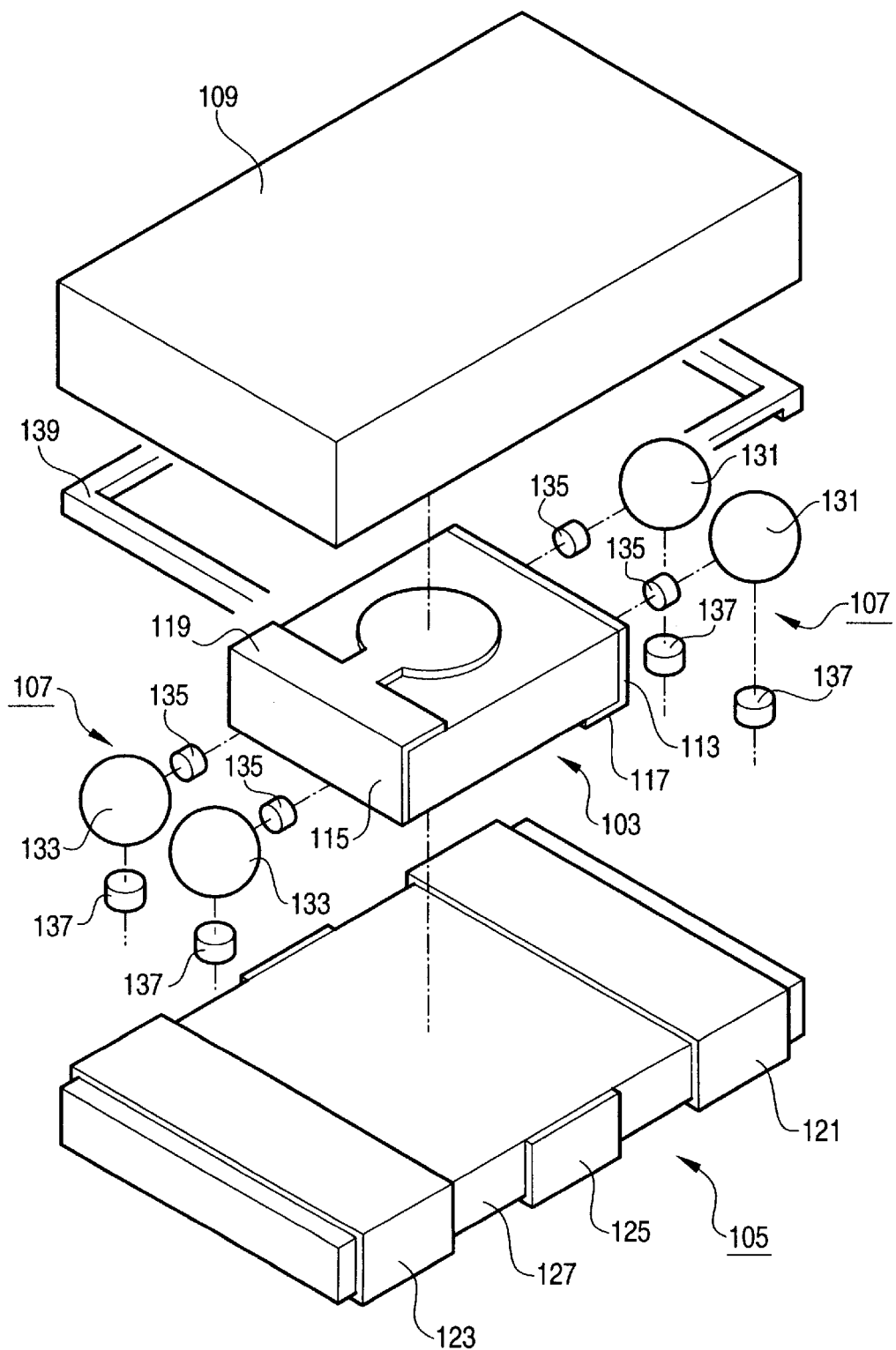
FIG. 33 is a broken perspective view of the piezoelectric resonating part of FIG. 1.

FIG. 31 is a perspective view of a piezoelectric resonating part according to the present invention shown in an assembled condition, partially in section. FIG. 32 is an enlarged side view of FIG. 31 shown as partly sectioned. FIG. 33 is a disassembled perspective view of the piezoelectric resonating part as shown in FIGS. 31 and 32. The shown piezoelectric resonating part includes a piezoelectric resonator 103, a substrate 105, a connecting conductors 107 and a cap 109.

The piezoelectric resonator 103 includes a piezoelectric element 111, a plurality of side electrodes 113, 115 and a plurality of vibrating electrodes 117, 119. The vibration electrodes 117, 119 are formed on the piezoelectric element 111 at one and the opposite sides in the thickness direction thereof as being opposite to each other with the piezoelectric element 111 being inbetween. The side electrodes 113, 115 are formed on the piezoelectric element 111 at one and the opposite sides in the length direction thereof as being opposite to each other with the piezoelectric element 111 being located inbetween. The side electrode 113 is conducted to the vibration electrode 117 and the side electrode 115 is conducted to the vibration electrode 119 with electrical and mechanical connection.

Further, the piezoelectric element 111 is formed of a sintered member which is ground to have a predetermined thickness and polarized in a high electric field. The piezoelectric element 111 is made of a non-lead material containing no PbO which will otherwise cause an environmental pollution.

The vibration electrodes 117, 119 and the side electrodes 113, 115 may be formed by a laminate formation technique such as a vacuum vapor deposition method or a spatter formation method. Materials of vibration electrodes 117, 119 and side electrodes 113, 115 may include Ag, Cu, Cr and others.

The substrate 105 is composed of a substrate body 127 and a plurality of terminal electrodes 121, 123, 125 which are formed on the surface of the substrate body 127. The terminal electrodes 121, 123 are wound around the substrate body 127 as extended in one round respectively. Capacities are provided between the terminal electrode 121 and terminal electrode 125 and between the terminal electrode 123 and terminal electrode 125 respectively.

The connecting conductors 107 include metal balls 131, 133 and electrically conductive adhesives 135, 137. The metal balls are of a size of, for example, 0.3 to 0.5 mm, and may be selected from a solder ball of non-lead family, a copper (Cu) ball, a tin (Sn) plated ball having a core of copper and the like. The material of the solder ball of non-lead family may be at least one group selected from Sn—Sb, Sn—Sb—Cu, Sn—Ag, Sn—Ag—Cu, Sn—Ag—Cu—Bi, Sn—Ag—Cu—In, Sn—Zn, Sn—Zn—Bi and others in view of the environmental contamination. The tin plating thickness is 5 μm to 30 μm. More precisely, the metal balls 131, 133 to be used may be plating coated balls (Cu core+Sn plating layer: plating thickness 5 μm to 30 μm), ball diameter 0.3 to 0.5 mm or Cu balls (not plated), ball diameter 0.3 to 0.5 φmm.

The electrically conductive adhesives 135, 137 may contains silver (Ag) and one selected from phenol resin, mixture base of urethane resin and epoxy resin or epoxy resin base. One of curing conditions of electrically conductive paste is shown as follows by way of example.

Phenol family: 150° C.×30 min (in Air)
Urethane/epoxy family: 170° C.×10 min (in Air)
Epoxy family: 200° C.×30 min (in Air)

As an assembly of the constituent parts, the piezoelectric resonator 103 is mounted to the substrate 105. The metal balls 131, 133 are located between the piezoelectric resonator 103 and the substrate 105 with a clearance G being provided between the piezoelectric resonator 103 and the substrate 105.

The metal balls 131, 133 are located in point-contact with the side electrodes 113, 115 of the piezoelectric resonator 103 respectively. The electrically conductive adhesives 135 are attached to around the point-contact portions. Thus the metal balls 131, 133 are fixed to the side electrodes 113, 115 respectively and the electrical and mechanical connection is established.

The electrically conductive adhesives 135 to be used in connection with the side electrodes 113, 115 are preferable to have flexibility to make use of the property of the piezoelectric resonator 103. It is, therefore, recommended to use the mixture of urethane resin and epoxy resin or phenol family in preference to epoxy resin base.

Further the metal balls 131, 133 are located on and in point-contact with the surfaces of terminal electrodes 121, 123 which are wound around the substrate 127 as extended one complete round thereof respectively. The surfaces terminal electrodes 121, 123 is in opposite to the piezoelectric resonator 103. The point-contact portions are adhered with the electrically conductive adhesives 137. Thus the metal balls 131, 133 are fixed to the terminal electrodes 121, 123 and the electrical and mechanical connection is established.

The electrically conductive adhesives 137 to be used in connection with the terminal electrodes 121, 123 is not required to have so much flexibility as is required in case of the side electrodes 113, 115. Therefore, the adhesive of epoxy base may be used.

The piezoelectric resonator 103 and the substrate 105 are assembled in the order as follows by way of example.

At first, the electrically conductive adhesives 135 are coated on the side electrodes 113, 115 which are secured to the piezoelectric resonator 103. Subsequently the metal balls 131, 133 are located on the coated electrically conductive adhesives 135, and the coated electrically conductive adhesives 135 are cured by drying.

The electrically conductive adhesives 137 are then coated on the terminal electrodes 121, 123 which are provided on the substrate 105.

Subsequently, the piezoelectric resonator 103 is mounted to the substrate 105 as is directed such that the fixed metal balls 131, 133 may come in contact with the surfaces of substrate 105 where the electrically conductive adhesives 137 are coated, and the electrically conductive adhesives 137 coated on the terminal electrodes 121, 123 are cured by drying.

The electrically conductive adhesives 135, 137 are cured by drying. As to the curing conditions by way of example, the phenol resin base is cured at 150° C. for 30 minutes. The mixture of urethane resin and epoxy resin is cured at 170° C. for 10 minutes. The epoxy resin base is cured at 200° C. for 30 minutes.

After the piezoelectric resonator 103 is fixedly mounted to the substrate 105, the cap 109 is secured to the substrate 105 by means of an isolation adhesive 139 with an airtight sealing structure.

Figure 34:
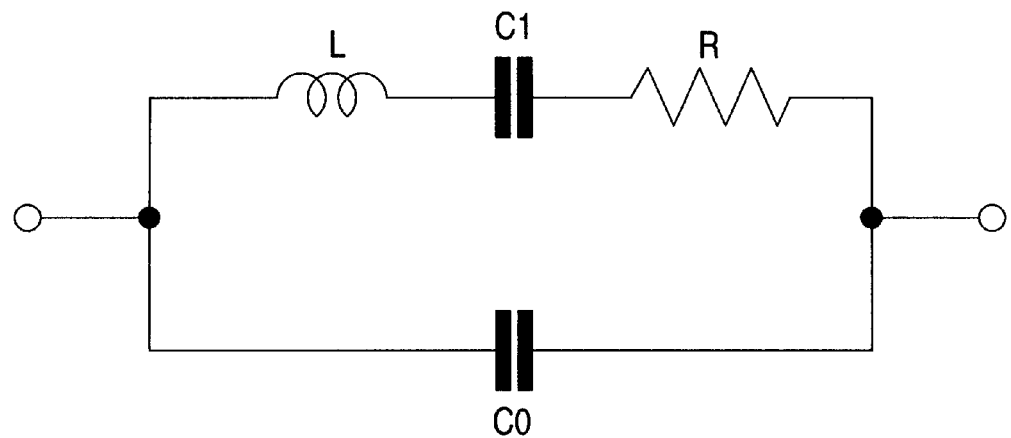
FIG. 34 is an equivalent circuit diagram of the piezoelectric resonating part.

FIG. 34 shows an equivalent circuit of the piezoelectric resonator itself. The piezoelectric resonator includes an equivalent resistor R, an equivalent inductance L, an equivalent capacitance C1 and an inter-electrode capacitance Co.

Figure 35:
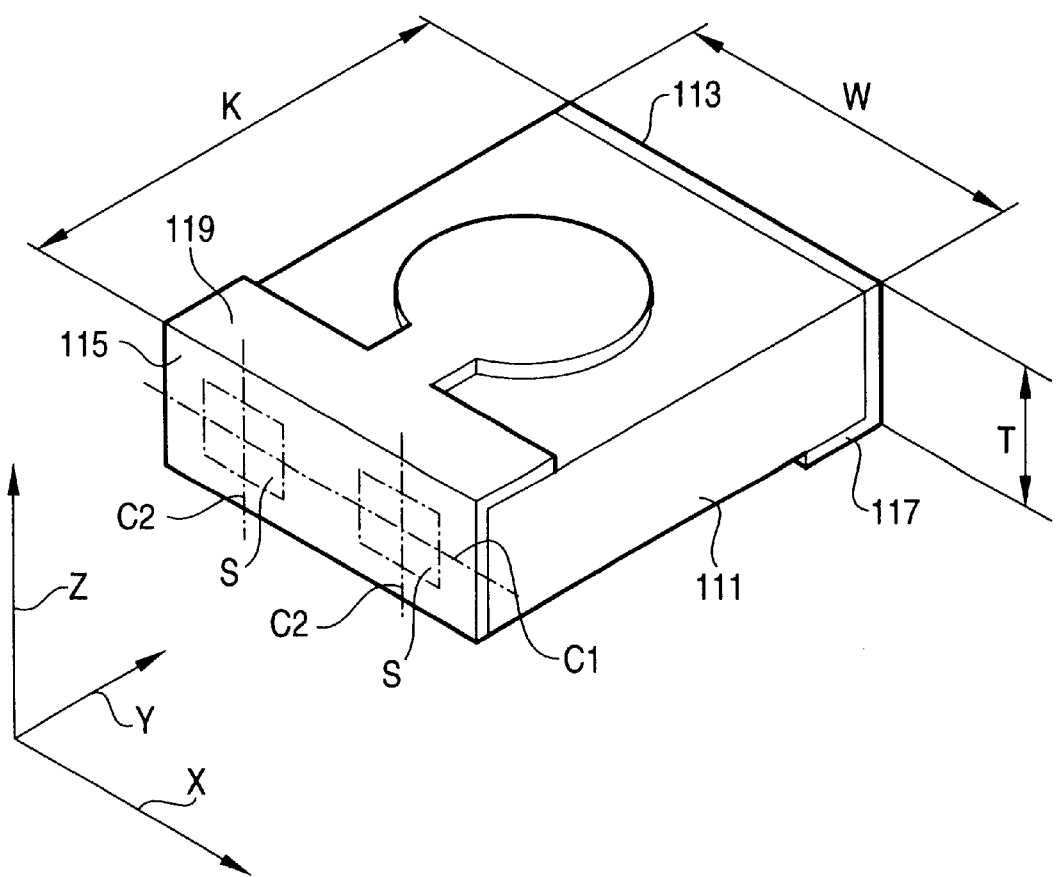
FIG. 35 is an enlarged perspective view of a piezoelectric resonator itself.

FIG. 35 shows an enlarged perspective view of the piezoelectric resonator. As was shown above, the piezoelectric resonator 103 includes the piezoelectric element 111, the side electrodes 113, 115 and the vibrating electrodes 117, 119.

By way of example, the size of piezoelectric resonator 103 is as follows: The width W in a direction X as shown by the arrow is 1 mm to 1.2 mm, the thickness T in a direction Z is 0.4 mm to 0.5 mm and the length K in a direction Y is 1 mm to 1.2 mm.

The piezoelectric resonator according to present the invention is designed to utilize the basic wave vibration of a thickness extensional basic vibration mode. The direction of vibration displacement to be utilized is the Z direction. The vibration displacement is, as a matter of course, largest at the central parts of the surfaces in the Z direction where the vibrating electrodes 117, 119 are formed.

As is shown in FIG. 32, the piezoelectric resonator 103 is supported by the metal balls 131, 133 at the portions of the side electrodes 113, 115 thereof. The supported side electrodes 113, 115 are located at one side and the opposite side in the direction Y. The one side and the opposite side in the direction Y are generally normal to the direction Z that is a direction of thickness extensional vibration displacement to be utilized. Therefore, the vibration displacement is small at the one side and the opposite side. Further, the orientation of piezoelectric resonator that is generally normal to the direction of vibration displacement will very scarcely disturb the thickness extensional vibration displacement to be utilized.

Therefore, according to the structure wherein the piezoelectric resonator 103 is supported by the metal balls 131, 133 at the portions of the side electrodes 113, 115, it is possible to avoid the deterioration of resonating property which may be caused by attenuation of vibration energy and suppression of unnecessary vibration.

Further, since the piezoelectric resonator 103 is supported by the point-contact structure, this will further reduce the factors to disturb the vibration of piezoelectric resonator. With this support structure, it becomes possible to produce a piezoelectric resonator of high value of Q max.

At the side portions, the regions where the vibration displacement is little occupy wide areas. The two regions indicated by S are of especially little vibration displacement. In FIG. 35, the regions S show the areas where high resonation property may be obtained. The region S are optimum portions as support-point positions where the metal balls 131, 133 are contacted to the portions. Each of the regions S has a center at the point of intersection into four parts defined by the middle of thickness T indicated by C1 and by the width W indicated by C2, the center being of a height in the area that is about one-half (½) of thickness T and the width being about one-fourth (¼) of total width W. However, this does not mean that regions other than the regions S are not adaptable as the support positions. In contrast to the conventional structure pasted as extended all length of the width, support positions other than the regions S may be determined to obtain a property of practical usage.

Figure 36:
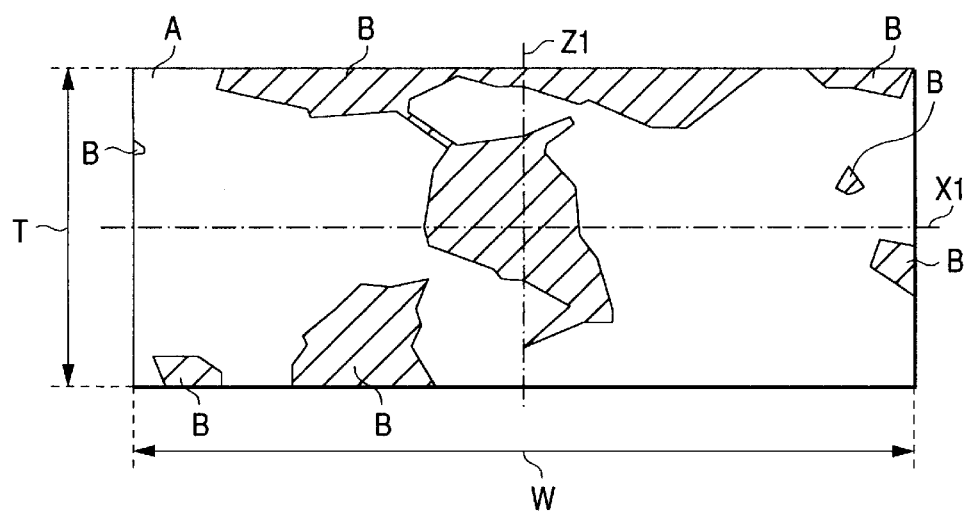
FIG. 36 is a diagram showing the distributions of vibration displacement amounts at one side of piezoelectric resonator.

FIG. 36 shows the distributions of the vibration displacement at the side of piezoelectric resonator. This drawing shows to measure the vibration displacement by use of laser rays. The thickness T is 0.5 mm and the width W is 1.2 mm. The portions B hatched with oblique lines are of displacement amounts 2 nm to 4 nm showing relatively high values. The other portions A free of hatches are of displacement amounts 2 nm or less. At this side there is no portion of displacement amount exceeding 4 nm which may be seen in the center of one side surface located in the direction Z as shown in FIG. 35. The regions S as shown in FIG. 35 are included in the portion A where the displacement amounts are 2 nm or less.

Figure 37:
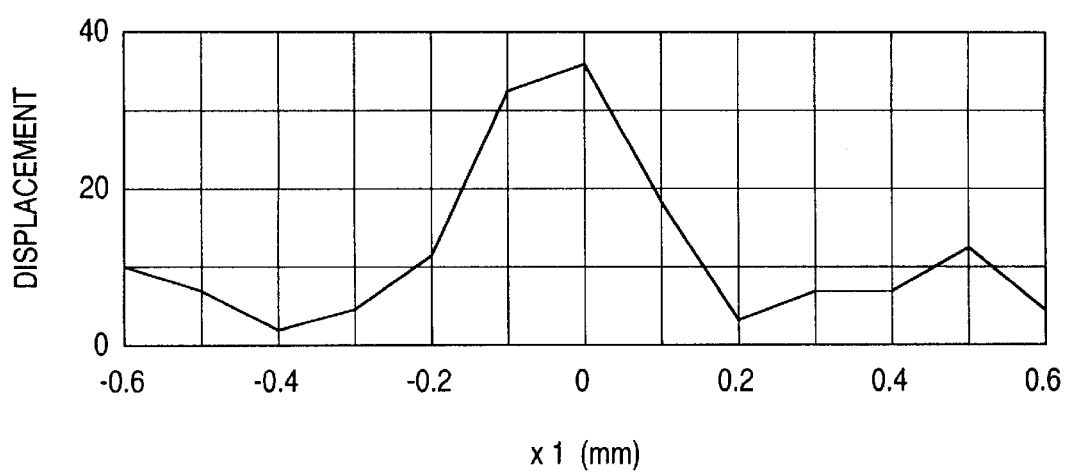
FIG. 37 is a graph showing the values of vibration displacement amounts measured at the central line X1 of FIG. 6.

FIG. 37 is a graph showing the values of displacement amounts measured on the central line X1 in FIG. 36. The lateral axis shows the positions on the central line X1 in FIG. 36. One scale is 0.1 mm and the entire width is 1.2 mm. The vertical axis shows the vibration displacement amounts and one scale is 1 nm. The maximum displacement amount is 3.6 nm which exists at the position Z1 as shown in FIG. 36. The regions S shown in FIG. 35 are included in the areas of approximately 1 nm or less.

Figure 38:
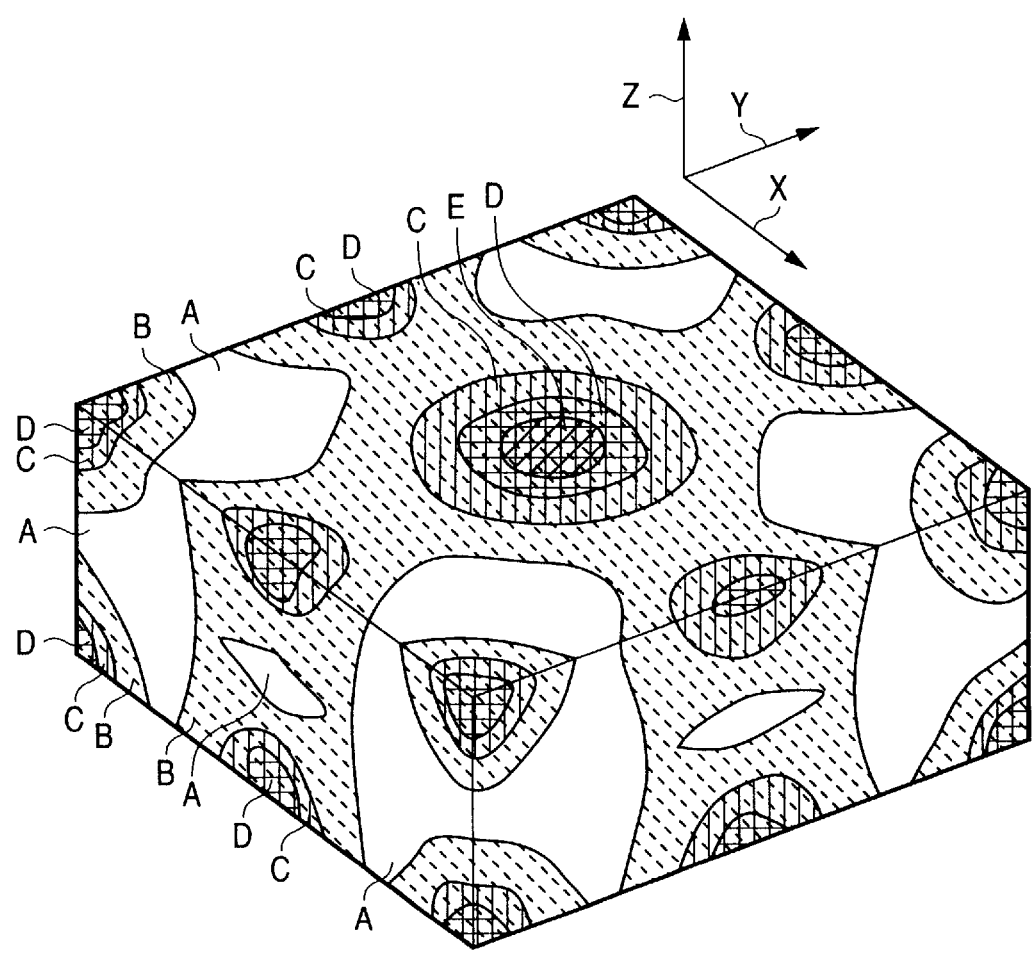
FIG. 38 is a diagram showing the distributions of vibration displacement amounts at piezoelectric resonator obtained by model analysis.

FIG. 38 is a graph showing the distributions of vibration displacement amounts of piezoelectric resonator by analysis of a model. The size of model employed in the simulation of computer is in the scope of size of the piezoelectric resonator itself as shown in FIG. 35. The directions X, Y and Z are the same with those as shown in FIG. 35. The vibration displacement amounts are divided in five steps, wherein the white portions A are of minimum displacement amount and followed by in the order of chain-lined portions B, vertical-lined portions C, lateral-lined portions D and oblique-lined portions E. The portions hatched as overlapped more are of so much amounts of vibration displacement. The central portion E of upper surface located in the direction Z shows a maximum amount of displacement. Further, compared with the upper surface located in the direction Z, the side portions located in the X and Y directions represent less amounts of vibration displacement, and the X and Y directions represent no portions corresponding to the central portion of the upper surface located in the direction Z where the displacement amount is maximum.

The S regions as shown in FIG. 35 are partly located respectively in the white areas A where the displacement amount is minimum among the five stepped divisions and partly located respectively in the areas B hatched with dotted lines where the displacement amount is more next to the areas A.

Figure 39:
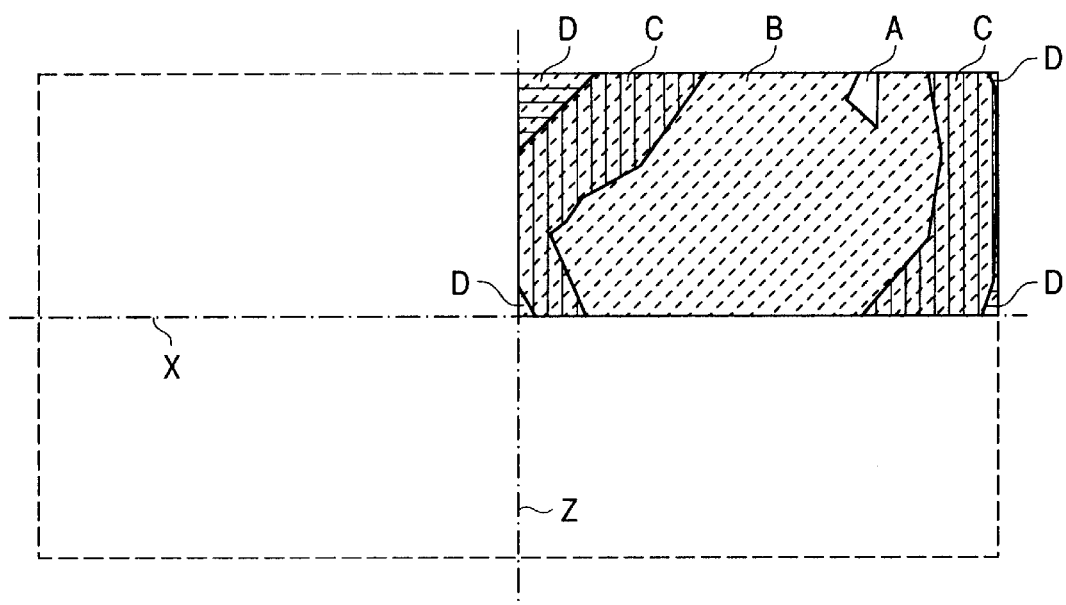
FIG. 39 is a diagram showing the distributions of the values of resonation property of piezoelectric resonator obtained by probe contact.

FIG. 39 shows the distributions of resonating property values on piezoelectric resonator detected by a probe. The distributions were obtained with measurement of the change of Q max values by the probe contacting one-fourth (¼) area of one side of piezoelectric resonator. The Q max values are represented in four steps. The hatched areas are overlapped from "good" to "bad". The white area A is best with Q max values 30 to 25. The area B hatched with dotted lines only is Q max values 25 to 20. The additional area C hatched with vertical lines is Q max values 20 to 15. The further additional area D hatched with lateral lines is Q max values 15 to 10.

The S regions as shown in FIG. 35 are generally confined respectively in the areas B of the Q max value 25 to 20 as hatched with dotted lines among the four stepped areas.

With the vibration displacement amounts and Q max values at the sides of piezoelectric resonator having been inspected in reference to FIGS. 36 to 39, it may be said that the S regions as shown in FIG. 35 are of minimum amount of vibration displacement with high Q max values.

As described above, according to the point contact structure wherein the piezoelectric resonator 103 is supported by the metal balls 131, 133 contacting the side electrodes 113, 115 at the points thereof respectively, the thickness extensional fundamental vibration mode may be utilized to obtain a piezoelectric resonating part of excellent resonation property which may prevent the attenuation of vibration energy, the unnecessary vibrations and the deterioration of resonant property.

What is claimed is:

1. A piezoelectric resonator comprising:
a piezoelectric substrate containing a piezoelectric material of an effective Poisson's ratio being less than 1/3, said piezoelectric substrate having a pair of opposite faces; and
a pair of vibrating electrode means on said opposite faces for generating a thickness extensional fundamental wave as a vibration mode;
wherein the opposite faces of the piezoelectric substrate are rectangular; and
the sum of a length of a vertical side of the one face and a length of the other side of the same is limited within range from 2.22 to 2.24 mm or range from 2.34 to 2.48 mm.

2. The piezoelectric resonator according to claim 1, wherein respective lengths of one sides of the opposite faces are limited within range from 1.06 to 1.24 mm, and respective lengths of the other sides are limited within range from 1.16 to 1.30 mm.

3. The piezoelectric resonator according to claim 2, wherein respective lengths of one sides of the opposite faces are limited within range from 1.16 to 1.22 mm, and respective lengths of the other sides are limited within range from 1.18 to 1.22 mm.

4. The piezoelectric resonator according to claim 1, wherein the piezoelectric substrate contains bismuth (Bi).

5. The piezoelectric resonator according to claim 4, wherein the bismuth layer compound structure contains bismuth-strontium (Sr)-titanium (Ti)-oxygen (O).

6. The piezoelectric resonator according to claim 4, wherein the bismuth layer compound structure contains bismuth-strontium (Sr)-lanthanum (La)-titanium (Ti)-oxygen (O).

7. A piezoelectric resonator comprising:
a piezoelectric substrate containing a piezoelectric material of an effective Poisson's ratio being less than 1/3, said piezoelectric substrate having a pair of opposite faces; and
a pair of vibrating electrode means on said opposite faces for generating a thickness extensional fundamental wave as a vibration mode;
wherein respective areas of the opposite faces of the piezoelectric substrate are, with respect to the one side, from 1.22 to 1.26 mm$^2$ or from 1.35 to 1.538 mm$^2$.

8. The piezoelectric resonator according to claim 7, wherein the piezoelectric substrate contains bismuth (Bi).

9. The piezoelectric resonator according to claim 8, wherein the bismuth layer compound structure contains bismuth-strontium (Sr)-titanium (Ti)-oxygen (O).

10. The piezoelectric resonator according to claim 8, wherein the bismuth layer compound structure contains bismuth-strontium (Sr)-lanthanum (La)-titanium (Ti)-oxygen (O).

11. A piezoelectric resonator comprising:
a piezoelectric substrate containing a piezoelectric material of an effective Poisson's ratio being less than 1/3, said piezoelectric substrate having a pair of opposite faces; and
a pair of vibrating electrode means on said opposite faces for generating a thickness extensional fundamental wave as a vibration mode;
wherein the opposite faces of the piezoelectric substrate are rectangular;
a length of one side of the opposite face is limited within 5 times or less of the thickness of the piezoelectric substrate, and
a length of the other side perpendicular with said one side of the opposite face is limited within the range from 0.93 times to 1.07 times of the length of the one side.

12. The piezoelectric resonator according to claim 11, wherein areas of the vibrating electrodes are 6% or more of the areas of the opposite faces.

13. The piezoelectric resonator according to claim 11, wherein the piezoelectric substrate has a bismuth layer compound structure containing bismuth (Bi).

14. The piezoelectric resonator according to claim 13, wherein the bismuth layer compound structure contains bismuth-strontium (Sr)-titanium (Ti)-oxygen (O).

15. The piezoelectric resonator according to claim 13, wherein the bismuth layer compound structure contains bismuth-strontium-titanium-lanthanum (La)-manganese (Mn)-oxygen.

16. The piezoelectric resonator according to claim 11, wherein said opposite faces of the piezoelectric substrate are square.

17. A piezoelectric resonating part comprising a piezoelectric resonator, a substrate and connecting conductors;
wherein the piezoelectric resonator is operated in a thickness extensional vibration mode, and has two side electrodes provided at two opposite sides thereof which are different from the sides located in the thickness direction thereof, said side electrodes being conducted to corresponding vibration electrodes respectively,
the substrate has terminal electrodes provided at a surface thereof; and
the connecting conductors include metal balls which are located between said side electrodes of the piezoelectric resonator and said terminal electrodes of the substrate and fixedly connect the two members.

18. The piezoelectric resonating part according to claim 17, wherein the metal balls are connected to the side electrodes respectively at parts of the piezoelectric resonator where vibration is minimum.

19. The piezoelectric resonating part according to claim 17, wherein the piezoelectric resonator is designed to utilize basic wave vibration.

20. The piezoelectric resonating part according to claim 17, wherein the piezoelectric resonator includes a piezoelectric substrate formed with non-lead based piezoelectric material.

21. The piezoelectric resonating part according to claim 17, wherein said metal balls are electrically conductive balls composed of the non-lead based material.

22. A method of using a piezoelectric resonator, comprising:
- applying a voltage via a pair of vibrating electrodes to said piezoelectric resonator, thereby generating a thickness extensional vibration;
- wherein said piezoelectric resonator comprises a piezoelectric substrate containing a piezoelectric material of an effective Poisson's ratio being less than 1/3, said piezoelectric substrate having a pair of opposite faces; and
- said pair of vibrating electrodes on said opposite faces in correspondence;
    - wherein the opposite faces of the piezoelectric substrate are rectangular; and
    - the sum of a length of a vertical side of the one face and a length of the other side of the same is limited within range from 2.22 to 2.24 mm or range from 2.34 to 2.48 mm.

23. A method of using a piezoelectric resonator, comprising:
- applying a voltage via a pair of vibrating electrodes to said piezoelectric resonator, thereby generating a thickness extensional vibration;
- wherein said piezoelectric resonator comprises a piezoelectric substrate containing a piezoelectric material of an effective Poisson's ratio being less than 1/3, said piezoelectric substrate having a pair of opposite faces; and
- said pair of vibrating electrodes on said opposite faces in correspondence;
    - wherein respective areas of the opposite faces of the piezoelectric substrate are, with respect to the one side, from 1.22 to 1.26 $mm^2$ or from 1.35 to 1.538 $mm^2$.

24. A method of using a piezoelectric resonator, comprising:
- applying a voltage via a pair of vibrating electrodes to said piezoelectric resonator, thereby generating a thickness extensional vibration;
- wherein said piezoelectric resonator comprises a piezoelectric substrate containing a piezoelectric material of an effective Poisson's ratio being less than 1/3, said piezoelectric substrate having a pair of opposite faces; and
- said pair of vibrating electrodes on said opposite faces in correspondence;
    - wherein the opposite faces of the piezoelectric substrate are rectangular;
    - a length of one side of the opposite face is limited within 5 times or less of the thickness of the piezoelectric substrate, and
    - a length of the other side perpendicular with said one side of the opposite face is limited within the range from 0.93 times to 1.07 times of the length of the one side.

* * * * *